US009117628B2

(12) United States Patent
Kirkpatrick et al.

(10) Patent No.: US 9,117,628 B2
(45) Date of Patent: Aug. 25, 2015

(54) DIAGNOSTIC METHOD AND APPARATUS FOR CHARACTERIZATION OF A NEUTRAL BEAM AND FOR PROCESS CONTROL THEREWITH

(71) Applicants: Sean R. Kirkpatrick, Littleton, MA (US); Allen R. Kirkpatrick, Carlisle, MA (US)

(72) Inventors: Sean R. Kirkpatrick, Littleton, MA (US); Allen R. Kirkpatrick, Carlisle, MA (US)

(73) Assignee: Exogenesis Corporation, Billerica, MA (US)

( * ) Notice: Subject to any disclaimer, the term of this patent is extended or adjusted under 35 U.S.C. 154(b) by 269 days.

(21) Appl. No.: 13/660,295

(22) Filed: Oct. 25, 2012

(65) Prior Publication Data
US 2013/0105710 A1 May 2, 2013

Related U.S. Application Data

(60) Provisional application No. 61/551,552, filed on Oct. 26, 2011.

(51) Int. Cl.
*H01J 37/244* (2006.01)
*H01L 21/265* (2006.01)
*H01J 37/304* (2006.01)
*H01J 37/317* (2006.01)

(52) U.S. Cl.
CPC .......... *H01J 37/244* (2013.01); *H01J 37/304* (2013.01); *H01J 37/317* (2013.01); *H01L 21/26566* (2013.01); *H01J 2237/0812* (2013.01); *H01J 2237/24514* (2013.01)

(58) Field of Classification Search
CPC ................ H01J 2237/0812; H01L 21/26566

USPC ............... 250/472.1, 492.3, 492.21
See application file for complete search history.

(56) References Cited

U.S. PATENT DOCUMENTS

| 5,511,408 | A | 4/1996 | Yoshioka |
| 5,637,188 | A * | 6/1997 | Amme et al. ............. 438/708 |
| 6,737,643 | B2 * | 5/2004 | Torti et al. ................. 250/288 |
| 7,060,989 | B2 | 6/2006 | Swenson et al. |
| 2004/0222389 | A1 * | 11/2004 | Swenson ............... 250/492.21 |
| 2006/0102854 | A1 * | 5/2006 | Neogi et al. ............ 250/492.1 |
| 2009/0236314 | A1 | 9/2009 | Chen |
| 2009/0321658 | A1 * | 12/2009 | Kirkpatrick et al. ..... 250/455.11 |
| 2010/0062547 | A1 | 3/2010 | Hadidi et al. |
| 2010/0227142 | A1 | 9/2010 | Hautala et al. |
| 2011/0300599 | A1 * | 12/2011 | Khoury et al. ............. 435/180 |

OTHER PUBLICATIONS

International Preliminary Report on Patentability dated Apr. 29, 2014 for International Application No. PCT/US12/61862.
International Search Report and Written Opinion dated Jan. 18, 2013 for International Application No. PCT/US12/61862.

* cited by examiner

*Primary Examiner* — David Porta
*Assistant Examiner* — Mindy Vu
(74) *Attorney, Agent, or Firm* — Burns & Levinson LLP; Jerry Cohen; David W. Gomes

(57) ABSTRACT

An apparatus and method for characterizing a particle beam provides receiving a particle beam in a central region of a reduced pressure enclosure; impacting the received beam against a beam strike that is thermally isolated from the enclosure; measuring a temperature change of the beam strike due to the impacting beam; measuring a pressure change in the enclosure due to receiving the beam; and processing the measured temperature change and the measured pressure change to determine beam characteristics.

24 Claims, 8 Drawing Sheets

DIAGNOSTIC METHOD AND APPARATUS FOR CHARACTERIZATION OF A NEUTRAL BEAM AND FOR PROCESS CONTROL THEREWITH

CROSS-REFERENCE TO RELATED APPLICATIONS

This application claims priority to U.S. Provisional Application No. 61/551,552 filed on Oct. 26, 2011 and entitled DIAGNOSTIC METHOD AND APPARATUS FOR CHARACTERIZATION OF A NEUTRAL BEAM AND FOR PROCESS CONTROL THEREWITH, the contents of which are incorporated by reference herein in their entirety and for all purposes.

FIELD OF THE INVENTION

This invention relates generally to diagnostic methods and apparatus for characterizing an accelerated neutral beam (which may be dissociated or partially dissociated) derived from an accelerated gas cluster ion beam (GCIB). Additionally, it relates to methods and apparatus for controlling dosimetry for workpiece processing by irradiation with an accelerated neutral beam (which may be dissociated or partially dissociated) derived from an accelerated gas cluster ion beam.

BACKGROUND OF THE INVENTION

Ions have long been favored for many processes because their electric charge facilitates their manipulation by electrostatic and magnetic fields. This introduces great flexibility in processing. However, in some applications, the charge that is inherent to any ion (including gas cluster ions in a GCIB) may produce undesirable effects in the processed surfaces. GCIB has a distinct advantage over conventional ion beams in that a as cluster ion with a single or small multiple charges enables the transport and control of a much larger mass-flow (a cluster may consist of hundreds or thousands of molecules) compared to a conventional ion (a single ionized atom, molecule, or molecular fragment.) Particularly in the case of insulating materials, surfaces processed using ions often suffer from charge-induced damage resulting from abrupt discharge of accumulated charges, or production of damaging electrical field-induced stress in the material (again resulting from accumulated charges.) In many such cases, GCIBs have an advantage due to their relatively low charge per mass, but in some instances may not eliminate the target-charging problem. Furthermore, moderate to high current ion beams may suffer from a significant space charge-induced defocusing of the beam that tends to inhibit transporting a well-focused beam over long distances. Again, due to their lower charge per mass relative to conventional ion beams, GCIBs have an advantage, but they do not fully eliminate the space charge transport problem.

A further instance of need or opportunity arises from the fact that although the use of beams of neutral molecules or atoms provides benefit in some surface processing applications and in space charge-free beam transport, it has not generally been easy and economical to produce intense beams of neutral molecules or atoms except for the case of nozzle jets, where the energies are generally on the order of a few milli-electron-volts per atom or molecule, and thus have limited processing capabilities. More energetic neutral particles can be beneficial or necessary in many applications, for example when it is desirable to break surface or shallow subsurface bonds to facilitate cleaning, etching, smoothing, deposition, amorphization, or to produce surface chemistry effects. In such cases, energies of from about an eV up to a few thousands of eV per particle can often be useful. Methods and apparatus for forming such Neutral Beams by first forming an accelerated charged GCIB and then neutralizing or arranging for neutralization of at least a fraction of the beam and separating the charged and uncharged fractions are disclosed herein. Although GCIB processing has been employed successfully for many applications, there are new and existing application needs not fully met by GCIB or other state of the art methods and apparatus, and wherein accelerated Neutral Beams may provide superior results. For example, in many situations, while a GCIB can produce dramatic atomic-scale smoothing of an initially somewhat rough surface, the ultimate smoothing that can be achieved is often less than the required smoothness, and in other situations GCIB processing can result in roughening moderately smooth surfaces rather than smoothing them further.

Historically, when conventional ion beams and GCIBs have been used for workpiece processing, repeatability of processing results has been achieved by using a process dosimetry technique that employs measurement of beam electrical current at the workpiece, integrated over time, and taking into account the size of the processed area to determine a dose in ions/cm$^2$. By controlling the dose (ions/cm$^2$) and the beam energy, good repeatability is achieved for most processes. Often other factors must also be controlled to achieve the desired process results (such as limiting workpiece temperature excursions and beam direction of incidence during processing, etc.) but the dose in ions/cm$^2$ and the beam energy are often the main processing parameters that are controlled to produce repeatable results.

In the case of Neutral Beams and Dissociated Neutral Beams, because the beam particles are not charged, their flux cannot be determined by a current measurement, and thus some other method of dosimetry is required, when acceptable processing results depend on precision control of the processing dose.

It is therefore an object of this invention to provide diagnostic methods and apparatus for characterizing Neutral Beams and Dissociated Neutral Beams.

It is a further object of this invention to provide diagnostic methods and apparatus for characterizing Neutral Beams and Dissociated Neutral Beams to a degree that enables more precise process dosimetry that results in repeatable workpiece processing.

SUMMARY OF THE INVENTION

The present invention is directed to the use of a combination of sensors and measurements made by those sensors that are combined to characterize a Neutral Beam or Dissociated Neutral Beam in a way that enables improved dosimetry for workpiece processing control.

Beams of energetic conventional ions, accelerated electrically charged atoms or molecules, are widely utilized to form semiconductor device junctions, to modify surfaces by sputtering, and to modify the properties of thin films. Unlike conventional ions, gas cluster ions are formed from clusters of large numbers (having a typical distribution of several hundreds to several thousands with a mean value of a few thousand) of weakly bound atoms or molecules of materials that are gaseous under conditions of standard temperature and pressure (commonly oxygen, nitrogen, or an inert gas such as argon, for example, but any condensable gas can be used to generate gas cluster ions) with each cluster sharing one or more electrical charges, and which are accelerated together through large electric potential differences (on the order of from about 3 kV to about 70 kV or more) to have high total energies. After gas cluster ions have been formed and accelerated, their charge states may be altered or become altered (even neutralized), and they may fragment or may be induced to fragment into smaller cluster ions or into monomer ions and/or neutralized smaller clusters and neutralized monomers, but they tend to retain the relatively high velocities and energies that result from having been accelerated through large electric potential differences, with the energy being distributed over the fragments.

Being weakly bound, gas cluster ions (or neutral gas clusters) disintegrate upon impact with a surface and the total energy of the accelerated gas cluster ion is shared among the constituent atoms. Because of this energy sharing, the monomers in the clusters are individually much less energetic (after disintegration) than as is the case for similarly accelerated conventional ions and, as a result, the atoms penetrate to much shallower depths, despite the high total energy of the accelerated gas cluster. As used herein, the terms "GCIB" and "gas cluster ion beam" are intended to encompass not only ionized beams and ions, but also beams in which a portion of the particles are not ionized. The terms "GCIB" and "gas cluster ion beam" are intended to encompass all beams that comprise gas cluster ions even though they may also comprise non-clustered ions and/or neutral particles. As used herein, the term "Neutral Beam" is intended to mean a beam of neutral gas clusters and; or neutral monomers derived from an accelerated gas cluster ion beam and wherein the acceleration results from acceleration of a gas cluster ion beam. As used herein, the term "Dissociated Neutral Beam" is intended to mean a beam consisting essentially of accelerated neutral monomers derived from an accelerated gas cluster ion beam and wherein the acceleration has resulted from acceleration of gas cluster ions. As used herein, the term "monomer" refers equally to either a single atom or a single molecule. The terms "atom," "molecule," and "monomer" may be used interchangeably and all refer to the appropriate monomer that is characteristic of the gas under discussion (either a component of a cluster, a component of a cluster ion, or an atom or molecule). For example, a monatomic gas like argon may be referred to in terms of atoms, molecules, or monomers and each of those terms means a single atom. Likewise, in the case of a diatomic gas like nitrogen, it may be referred to in terms of atoms, molecules, or monomers, each term meaning a diatomic molecule. Furthermore a molecular gas like $CO_2$, may be referred to in terms of atoms, molecules, or monomers, each term meaning a three atom molecule, and so forth. These conventions are used to simplify generic discussions of gases and gas clusters or gas cluster ions independent of whether they are monatomic, diatomic, or molecular in their gaseous form.

When an accelerated gas cluster ion is fully dissociated and neutralized, the resulting neutral monomers have energies approximately equal to the total energy of the original accelerated gas cluster ion, divided by the number, $N_I$, of monomers that comprised the original gas cluster ion at the time it was accelerated. Such dissociated neutral monomers have energies on the order of from about 1 eV to tens or even as much as a few thousands of eV, depending on the original accelerated energy of the gas cluster ion and the size of the gas cluster at the time of acceleration. The processing effect of such dissociated neutralized accelerated monomers is dependent on both the number of such monomers that strike a given surface area on a workpiece and also the energies associated with such monomer.

Gas cluster ion beams are generated and transported for purposes of irradiating a workpiece according to known techniques. Various types of holders are known in the art for holding the object in the path of the GCIB for irradiation and for manipulating the object to permit irradiation of a multiplicity of portions of the object. Neutral Beams and Dissociated Neutral Beams may be generated and transported for purposes of irradiating a workpiece according to techniques taught herein.

The present invention may employ a high beam purity method and system for deriving from an accelerated gas cluster ion beam an accelerated neutral gas cluster and/or preferably monomer beam that can be employed for a variety of types of surface and shallow subsurface materials processing and which is capable, for many applications, of superior performance compared to conventional GCIB processing. It can provide well-focused, accelerated, intense neutral monomer beams with particles having energies in the range of from about 1 eV to as much as a few thousand eV. This is an energy range in which it has been impractical with simple, relatively inexpensive apparatus to form intense neutral beams.

These accelerated Neutral Beams are generated by first forming a conventional accelerated GCIB, then partly or essentially fully dissociating it by methods and operating conditions that do not introduce impurities into the beam, then separating the remaining charged portions of the beam from the neutral portion, and subsequently using the resulting accelerated Neutral Beam for workpiece processing. Depending on the degree of dissociation of the gas cluster ions, the Neutral Beam produced may be a mixture of neutral gas monomers and gas clusters or may essentially consist entirely or almost entirely of neutral gas monomers. It is preferred that the accelerated Neutral Beam is a Dissociated Neutral Beam, since it is known that the presence of smaller sized clusters in Neutral Beams can produce effects that are undesirable in some applications.

An advantage of the Neutral Beams and Dissociated Neutral Beams that may be produced by the methods and apparatus of this invention, is that they may be used to process electrically insulating materials without producing damage to the material due to charging of the surfaces of such materials by beam transported charges as commonly occurs for all ionized beams including GCIB. For example, in semiconductor and other electronic processing applications, ions often contribute to damaging or destructive charging of thin dielectric films such as oxides, nitrides, etc. The use of Neutral Beams and Dissociated Neutral Beams can enable successful beam processing of polymer, dielectric, and/or other electrically insulating or high resistivity materials, coatings, and films in other applications where ion beams may produce undesired side effects due to surface or other charging effects. Examples include (without limitation) processing of corrosion inhibiting coatings, and irradiation cross-linking and/or polymerization of organic films. In other examples, Neutral Beam induced modifications of polymer or other dielectric materials (e.g. sterilization, smoothing, improving surface biocompatibility, and improving attachment of and/or control of elution rates of drugs) may enable the use of such materials in medical devices for implant and/or other medical/surgical applications. Further examples include Neutral Beam processing of glass, polymer, and ceramic bio-culture labware and/or environmental sampling surfaces where such beams may be used to improve surface characteristics like, for example, roughness, smoothness, hydrophilicity, and biocompatibility.

Since the parent GCIB, from which an accelerated Neutral Beam or Dissociated Neutral Beam may be formed by the methods and apparatus described herein, comprises ions it is readily accelerated to desired energy and is readily focused using conventional ion beam techniques. Upon subsequent dissociation and separation of the charged ions from the neutral particles, the neutral beam particles tend to retain their focused trajectories and may be transported for extensive distances with good effect.

When neutral gas clusters in a jet are ionized by electron bombardment, they become heated and/or excited. This may result in subsequent evaporation of monomers from the ionized gas cluster, after acceleration, as it travels down a beamline. Additionally, collisions of gas cluster ions with background gas molecules in the ionizer, accelerator and beamline regions, also heat and excite the as cluster ions and may result in additional subsequent evolution of monomers from the gas cluster ions following acceleration. When these mechanisms for evolution of monomers are induced by electron bombardment and/or collision with background gas molecules (and/or other gas clusters) of the same gas from which the GCIB was formed, no contamination is contributed to the beam by the dissociation processes that results in evolving the monomers.

There are other mechanisms that can be employed for dissociating (or inducing evolution of monomers from) gas cluster ions in a GCIB without introducing contamination into the beam. Some of these mechanisms may also be employed to dissociate neutral gas clusters in a neutral gas cluster beam. One mechanism is laser irradiation of the cluster-ion beam using infra-red or other laser energy. Laser-induced heating of the gas cluster ions in the laser irradiated GCIB results in excitement and/or heating of the gas cluster ions and causes subsequent evolution of monomers from the beam. Another mechanism is passing the beam through a thermally heated tube so that radiant thermal energy photons impact the gas cluster ions in beam. The induced heating of the gas cluster ions by the radiant thermal energy in the tube results in excitement and/or heating of the gas cluster ions and causes subsequent evolution of monomers from the beam. In another mechanism, crossing the gas cluster ion beam by a gas jet of the same gas or mixture as the source gas used in formation of the GCIB (or other non-contaminating gas) results in collisions of monomers of the gas in the gas jet with the gas clusters in the ion beam producing excitement and/or heating of the gas cluster ions in the beam and subsequent evolution of monomers from the excited gas cluster ions. By depending entirely on electron bombardment during initial ionization and/or collisions (with other cluster ions, or with background gas molecules of the same gas(es) as those used to form the GCIB) within the beam and/or laser or thermal radiation and/or crossed jet collisions of non-contaminating gas to produce the GCIB dissociation and/or fragmentation, contamination of the beam by collision with other materials is avoided.

As a neutral gas cluster jet from a nozzle travels through an ionizing region where electrons are directed to ionize the clusters, a cluster may remain un-ionized or may acquire a charge state, q, of one or more charges (by ejection of electrons from the cluster by an incident electron). The ionizer operating conditions influence the likelihood that a gas cluster will take on a particular charge state, with more intense ionizer conditions resulting in greater probability that a higher charge state will be achieved. More intense ionizer conditions resulting in higher ionization efficiency may result from higher electron flux and/or higher (within limits) electron energy. Once the gas cluster has been ionized, it is typically extracted from the ionizer, focused into a beam, and accelerated by falling through an electric field. The amount of acceleration of the gas cluster ion is readily controlled by controlling the magnitude of the accelerating electric field. Typical commercial GCIB processing tools generally provide for the gas cluster ions to be accelerated by an electric field having an adjustable accelerating potential, $V_{Acc}$, typically of for example, from about 1 kV to 70 kV (but not limited to that range—$V_{Acc}$ up to 200 kV or even more may be feasible). Thus a singly charged gas cluster ion achieves an energy in the range of from 1 to 70 keV (or more if larger $V_{Acc}$ is used) and a multiply charged (for example, without limitation, charge state, q=3 electronic charges) gas cluster ion achieves an energy in the range of from 3 to 210 keV (or more for higher $V_{Acc}$). For other gas cluster ion charge states and acceleration potentials, the accelerated energy per cluster is $qV_{Acc}$ eV. From a given ionizer with a given ionization efficiency, gas cluster ions will have a distribution of charge states from zero (not ionized) to a higher number such as for example 6 (or with high ionizer efficiency, even more), and the most probable and mean values of the charge state distribution also increase with increased ionizer efficiency (higher electron flux and/or energy). Higher ionizer efficiency also results in increased numbers of gas cluster ions being formed in the ionizer. In many cases, GCIB processing throughput increases when operating the ionizer at high efficiency results in increased GCIB current. A downside of such operation is that multiple charge states that may occur on intermediate size gas cluster ions can increase crater and/or rough interface formation by those ions, and often such effects may operate counterproductively to the intent of the processing. Thus for many GCIB surface processing recipes, selection of the ionizer operating parameters tends to involve more considerations than just maximizing beam current. In some processes, use of a "pressure cell" (see U.S. Pat. No. 7,060,989, to Swenson et al.) may be employed to permit operating an ionizer at high ionization efficiency while still obtaining acceptable beam processing performance by moderating the beam energy by gas collisions in an elevated pressure "pressure cell."

With the present invention there is no downside to operating the ionizer at high efficiency—in fact such operation is sometimes preferred. When the ionizer is operated at high efficiency, there may be a wide range of charge states in the gas cluster ions produced by the ionizer. This results in a wide range of velocities in the gas cluster ions in the extraction region between the ionizer and the beam accelerating electrodes, and also in the downstream beam. This may result in an enhanced frequency of collisions between and among gas cluster ions in the beam that generally results in a higher degree of fragmentation of the largest gas cluster ions. Such fragmentation may result in a redistribution of the cluster sizes in the beam, skewing it toward the smaller cluster sizes. These cluster fragments retain energy in proportion to their new size (N) and so become less energetic while essentially retaining the accelerated velocity of the initial unfragmented gas cluster ion. The change of energy with retention of velocity following collisions has been experimentally verified (as for example reported in Toyoda, N. et al., "Cluster size dependence on energy and velocity distributions of gas cluster ions after collisions with residual gas," *Nucl. & Meth. in Phys. Research* B 257 (2007), pp 662-665). Fragmentation may also result in redistribution of charges in the cluster fragments. Some uncharged fragments likely result and multi-charged gas cluster ions may fragment into several charged gas cluster ions and perhaps some uncharged fragments. It is understood by the inventors that design of the focusing fields in the ionizer and the extraction region may enhance the focusing of the smaller gas cluster ions and monomer ions to increase the likelihood of collision with larger gas cluster ions in the beam extraction region and in the downstream beam, thus contributing to the dissociation and/or fragmenting of the gas cluster ions.

In an embodiment of the present invention, background gas pressure in the ionizer, acceleration region, and beamline may optionally be arranged to have a higher pressure than is normally utilized for good GCIB transmission. This can result in additional evolution of monomers from gas cluster ions (beyond that resulting from the heating and/or excitement resulting from the initial gas cluster ionization event). Pressure may be arranged so that gas cluster ions have a short enough mean-free-path and a long enough flight path between ionizer and workpiece that they must undergo multiple collisions with background gas molecules.

For a homogeneous gas cluster ion containing N monomers and having a charge state of q and which has been accelerated through an electric field potential drop of $V_{Acc}$ volts, the cluster will have an energy of approximately $qV_{Acc}/N_I$ eV per monomer, where $N_I$ is the number of monomers in the cluster ion at the time of acceleration. Except for the smallest gas cluster ions, a collision of such an ion with a background gas monomer of the same gas as the cluster source gas will result in additional deposition of approximately $qV_{Acc}/N_I$ eV into the gas cluster ion. This energy is relatively small compared to the overall gas cluster ion energy ($qV_{Acc}$) and generally results in excitation or heating of the cluster and in subsequent evolution of monomers from the cluster. It is believed that such collisions of larger clusters with background gas seldom fragment the cluster but rather heats and/or excites it to result in evolution of monomers by evaporation or similar mechanisms. Regardless of the source of the excitation that results in the evolution of a monomer or monomers from a gas cluster ion, the evolved monomer(s) have approximately the same energy per particle, $qV_{Acc}/N_I$ eV, and retain approximately the same velocity and trajectory as the gas cluster ion from which they have evolved. When such monomer evolutions occur from a gas cluster ion, whether they result from excitation or heating due to the original ionization event, a collision, or radiant heating, the charge has a high probability of remaining with the larger residual gas cluster ion. Thus after a sequence of monomer evolutions, a large gas cluster ion may be reduced to a cloud of co-traveling monomers with perhaps a smaller residual gas cluster ion (or possibly several if fragmentation has also occurred). The co-traveling monomers following the original beam trajectory all have approximately the same velocity as that of the original gas cluster ion and each has energy of approximately $qV_{Acc}/N_I$ eV. For small gas cluster ions, the energy of collision with a background gas monomer is likely to completely and violently dissociate the small gas cluster and it is uncertain whether in such cases the resulting monomers continue to travel with the beam or are ejected from the beam.

Prior to the GCIB reaching the workpiece, the remaining charged particles (gas cluster ions, particularly small and intermediate size gas cluster ions and some charged monomers, but also including any remaining large gas cluster ions) in the beam are separated from the neutral portion of the beam, leaving only a Neutral Beam for processing the workpiece.

In typical operation, the fraction of power in the neutral beam components relative to that in the full (charged plus neutral) beam delivered at the processing target is in the range of from about 5% to 95%, so by the separation methods and apparatus of the present invention it is possible to deliver that portion of the kinetic energy of the full accelerated charged beam to the target as a Neutral Beam.

The dissociation of the gas cluster ions and thus the production of high neutral monomer beam energy is facilitated by 1) Operating at higher acceleration voltages. This increases $qV_{Acc}/N$ for any given cluster size. 2) Operating at high ionizer efficiency. This increases $qV_{Acc}/N$ for any given cluster size by increasing q and increases cluster-ion on cluster-ion collisions in the extraction region due to the differences in charge states between clusters; 3) Operating at a high ionizer, acceleration region, or beamline pressure or operating with a gas jet crossing the beam, or with a longer beam path, all of which increase the probability of background gas collisions for a gas cluster ion of any given size; 4) Operating with laser irradiation or thermal radiant heating of the beam, which directly promote evolution of monomers from the gas cluster ions; and 5) Operating at higher nozzle gas flow, which increases transport of gas, clustered and perhaps unclustered into the GCIB trajectory, which increases collisions resulting in greater evolution of monomers.

Measurement of the Neutral Beam cannot be made by current measurement as is convenient for gas cluster ion beams. In one embodiment a Neutral Beam power sensor is used to facilitate dosimetry when irradiating a workpiece with a Neutral Beam. The Neutral Beam sensor is a thermal sensor that intercepts the beam (or optionally a known sample of the beam). The rate of rise of temperature of the sensor is related to the energy flux resulting from energetic beam irradiation of the sensor. The thermal measurements must be made over a limited range of sensor temperatures to minimize errors due to thermal re-radiation of the energy incident on the sensor. For a GCIB process, the beam power (watts) is equal to the beam current (amps) times $V_{Acc}$, the beam acceleration voltage. When a GCIB irradiates a workpiece for a period of time (seconds), the energy (joules) received by the workpiece is the product of the beam power and the irradiation time. The processing effect of such a beam when it processes an extended area is distributed over the area (for example, $cm^2$). For ion beams, it has been conveniently conventional to specify a processing dose in terms of irradiated ions/$cm^2$, where the ions are either known or assumed to have at the time of acceleration an average charge state, q, and to have been accelerated through a potential difference of, $V_{Acc}$ volts, so that each ion carries an energy of $qV_{Acc}$ eV (an eV is approximately $1.6 \times 10^{-19}$ joule). Thus an ion beam dose for an average charge state, q, accelerated by $V_{Acc}$ and specified in ions/$cm^2$ corresponds to a readily calculated energy dose expressible in joules/$cm^2$. For an accelerated Neutral Beam derived from an accelerated GCIB as utilized in the present invention, the value of q at the time of acceleration and the value of $V_{Acc}$ is the same for both of the (later-formed and separated) charged and uncharged fractions of the beam. The power in the two (neutral and charged) fractions of the GCIB divides in proportion to the mass in each beam fraction. Thus for the accelerated Neutral Beam as employed in the invention, when equal areas are irradiated for equal times, the energy dose (joules/$cm^2$) deposited by the Neutral Beam is necessarily less than the energy dose deposited by the full GCIB. By using a thermal sensor to measure the power in the full GCIB $P_G$ and that in the Neutral Beam $P_N$ (which is commonly found to be about 5% to 95% that of the full GCIB) it is possible to calculate a compensation factor for use in the Neutral Beam processing dosimetry. When $P_N$ is $aP_G$, then the compensation factor is, $k=1/a$. Thus if a workpiece is processed using a Neutral Beam derived from a GCIB, for a time duration is made to be k times greater than the processing duration for the full GCIB (including charged and neutral beam portions) required to achieve a dose of D ions/$cm^2$, then the energy doses deposited in the workpiece by both the Neutral Beam and the full GCIB are the same (though the results may be different due to qualitative differences in the processing effects due to differences of particle sizes in the two beams.) As used herein, a Neutral Beam process dose compensated in this way is sometimes described as having an energy/cm$^2$ equivalence of a dose of D ions/cm$^2$. Because of small differences in ionizers or gas jet nozzles, the cluster size distribution in the source and the charge state distribution in the ionized gas jet prior to acceleration can sometimes vary from setup to setup and from processing tool to processing tool. For many processes the dosimetry method described above provides adequate process repeatability. For some other processes, these variations in hardware may result in undesirably large process variation and lack of repeatability. In such cases a more complete characterization of the Neutral Beam or Dissociated Neutral Beam is desirable.

In such cases, a more complete characterization of the beam provides the precision required for improved process repeatability. In an embodiment described below, a diagnostic method and apparatus for thorough characterization of a Neutral Beam or a Dissociated Neutral Beam provides both a precise measurement of the flux of accelerated neutral particles in the beam and the mean energy per accelerated neutral particle. In the case of a Dissociated Neutral Beam, this corresponds to the accelerated neutral monomer flux and the mean energy per accelerated neutral monomer. Various other properties of the charged and uncharged, accelerated, and un-accelerated portions of the parent GCIB are determined by the technique and may be employed to assure process repeatability in workpiece processing applications of Neutral Beams and Dissociated Neutral Beams.

DETAILED DESCRIPTION OF THE PREFERRED METHODS AND EXEMPLARY EMBODIMENTS

In the following description, for simplification, item numbers from earlier-described figures may appear in subsequently described figures without discussion. Likewise, items discussed in relation to earlier figures may appear in subsequent figures without item numbers or additional description. In such cases items with like numbers are like items and have the previously-described features and functions, and illustration of items without item numbers shown in the present figure refer to like items having the same functions as the like items illustrated in earlier-discussed numbered figures.

Figure 1:
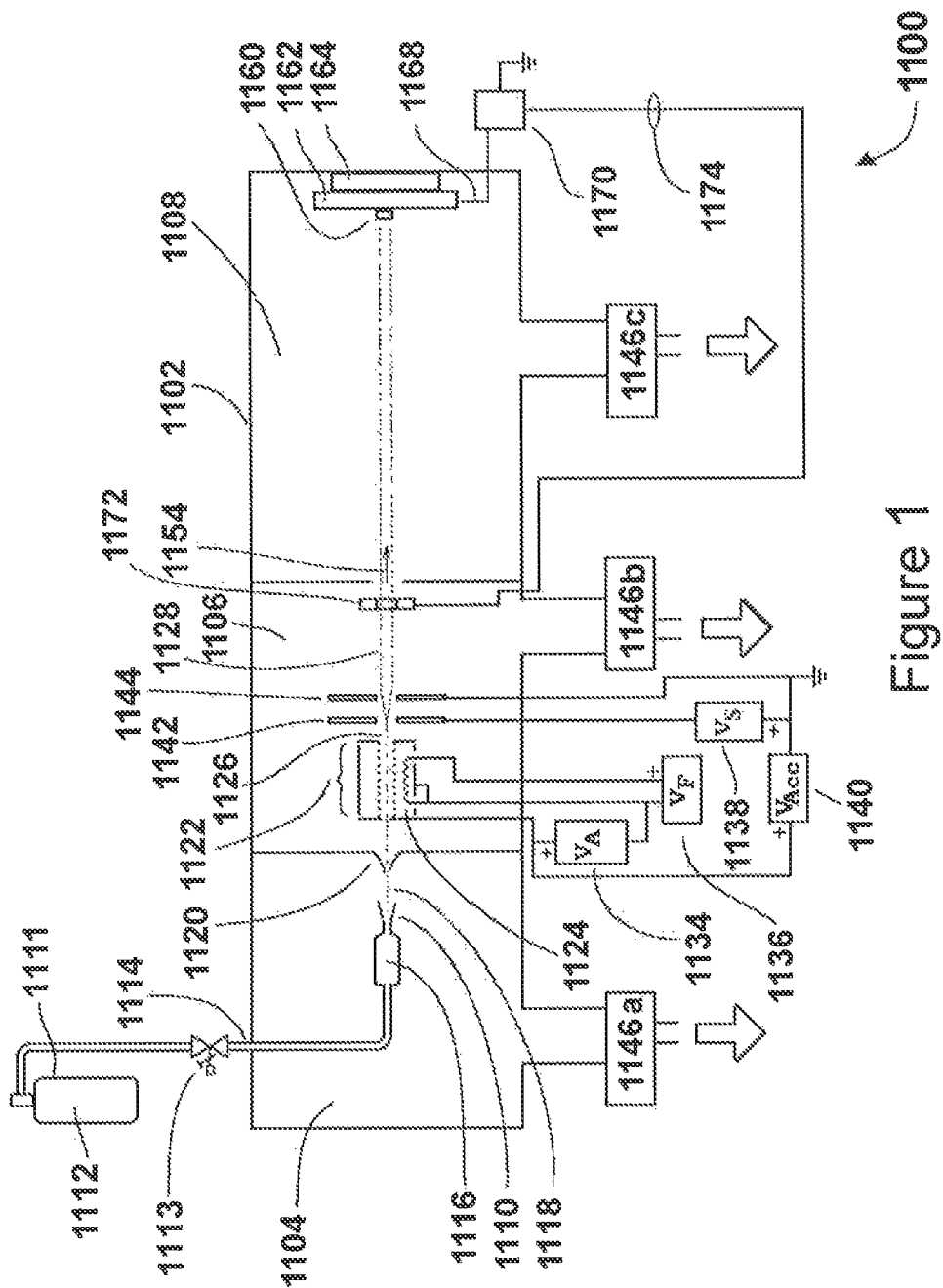
FIG. 1 is a schematic illustrating elements of a GCIB processing apparatus 1100 for processing a workpiece using a GCIB.

Reference is now made to FIG. 1, which shows a schematic configuration for a GCIB processing apparatus 1100. A low-pressure vessel 1102 has three fluidly connected chambers: a nozzle chamber 1104 an ionization/acceleration chamber 1106, and a processing chamber 1108. The three chambers are evacuated by vacuum pumps 1146a, 1146b, and 1146c, respectively. A pressurized condensable source gas 1112 (for example argon) stored in a gas storage cylinder 1111 flows through a gas metering valve 1113 and a feed tube 1114 into a stagnation chamber 1116. Pressure (typically a few atmospheres) in the stagnation chamber 1116 results in ejection of gas into the substantially lower pressure vacuum through a nozzle 1110, resulting in formation of a supersonic gas jet 1118. Cooling, resulting from the expansion in the jet, causes a portion of the gas jet 1118 to condense into clusters, each consisting of from several to several thousand weakly bound atoms or molecules. A gas skimmer aperture 1120 is employed to control flow of gas into the downstream chambers by partially separating gas molecules that have not condensed into a cluster jet from the cluster jet. Excessive pressure in the downstream chambers can be detrimental by interfering with the transport of gas cluster ions and by interfering with management of the high voltages that may be employed for beam formation and transport. Suitable condensable source gases 1112 include, but are not limited to argon and other condensable noble gases, nitrogen, carbon dioxide, oxygen, and many other gases and/or gas mixtures. After formation of the gas clusters in the supersonic gas jet 1118, at least a portion of the gas clusters are ionized in an ionizer 1122 that is typically an electron impact ionizer that produces electrons by thermal emission from one or more incandescent filaments 1124 (or from other suitable electron sources) and accelerates and directs the electrons, enabling them to collide with gas clusters in the gas jet 1118. Electron impacts with gas clusters eject electrons from some portion of the gas clusters, causing those clusters to become positively ionized. Some clusters may have more than one electron ejected and may become multiply ionized. Control of the number of electrons and their energies after acceleration typically influences the number of ionizations that may occur and the ratio between multiple and single ionizations of the gas clusters. A suppressor electrode 1142, and grounded electrode 1144 extract the cluster ions from the ionizer exit aperture 1126, accelerate them to a desired energy (typically with acceleration potentials of from several hundred V to several tens of kV), and focuses them to form a GCIB 1128. The region that the GCIB 1128 traverses between the ionizer exit aperture 1126 and the suppressor electrode 1142 is referred to as the "extraction region." The axis (determined at the nozzle 1110), of the supersonic gas jet 1118 containing gas clusters is substantially the same as the axis 1154 of the GCIB 1128. Filament power supply 1136 provides filament voltage $V_f$ to heat the ionizer filament 1124. Anode power supply 1134 provides anode voltage $V_A$ to accelerate thermoelectrons emitted from filament 1124 to cause the thermoelectrons to irradiate the cluster-containing gas jet 1118 to produce cluster ions. A suppression power supply 1138 supplies suppression voltage $V_S$ (on the order of several hundred to a few thousand volts) to bias suppressor electrode 1142. Accelerator power supply 1140 supplies acceleration voltage $V_{Acc}$ to bias the ionizer 1122 with respect to suppressor electrode 1142 and grounded electrode 1144 so as to result in a total GCIB acceleration potential equal to $V_{Acc}$. Suppressor electrode 1142 serves to extract ions from the ionizer exit aperture 1126 of ionizer 1122 and to prevent undesired electrons from entering the ionizer 1122 from downstream, and to form a focused GCIB 1128.

A workpiece 1160, which may (for example) be a medical device, a semiconductor material, an optical element, or other workpiece to be processed by GCIB processing, is held on a workpiece holder 1162, which disposes the workpiece in the path of the GCIB 1128. The workpiece holder is attached to but electrically insulated from the processing chamber 1108 by an electrical insulator 1164. Thus, GCIB 1128 striking the workpiece 1160 and the workpiece holder 1162 flows through an electrical lead 1168 to a dose processor 1170. A beam gate 1172 controls transmission of the GCIB 1128 along axis 1154 to the workpiece 1160. The beam gate 1172 typically has an open state and a closed state that is controlled by a linkage 1174 that may be (for example) electrical, mechanical, or electromechanical. Dose processor 1170 controls the open/closed state of the beam gate 1172 to manage the GCIB dose received by the workpiece 1160 and the workpiece holder 1162. In operation, the dose processor 1170 opens the beam gate 1172 to initiate GCIB irradiation of the workpiece 1160. Dose processor 1170 typically integrates GCIB electrical current arriving at the workpiece 1160 and workpiece holder 1162 to calculate an accumulated GCIB irradiation dose. At a predetermined dose, the dose processor 1170 closes the beam gate 1172, terminating processing when the predetermined dose has been achieved.

Figure 2:
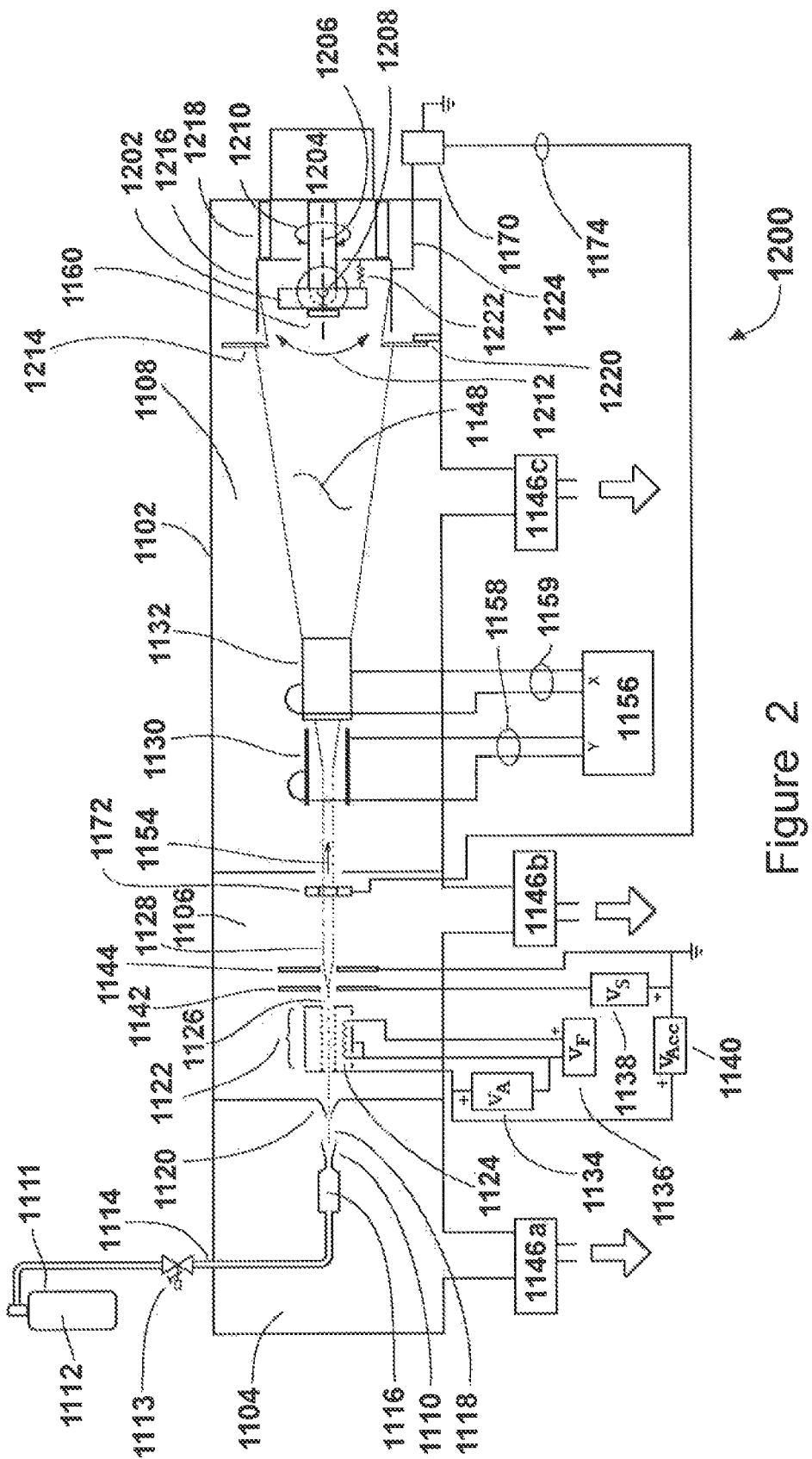
FIG. 2 is a schematic illustrating elements of another GCIB processing apparatus 1200 for workpiece processing using a GCIB, wherein scanning of the ion beam and manipulation of the workpiece is employed.

FIG. 2 shows a schematic illustrating elements of another GCIB processing apparatus 1200 for workpiece processing using a GCIB, wherein scanning of the ion beam and manipulation of the workpiece is employed. A workpiece 1160 to be processed by the GCIB processing apparatus 1200 is held on a workpiece holder 1202, disposed in the path of the GCIB 1128. In order to accomplish uniform processing of the workpiece 1160, the workpiece holder 1202 is designed to manipulate workpiece 1160, as may be required for uniform processing.

Any workpiece surfaces that are non-planar, for example, spherical or cup-like, rounded, irregular, or other un-flat configuration, may be oriented within a range of angles with respect to the beam incidence to obtain optimal GCIB processing of the workpiece surfaces. The workpiece holder 1202 can be fully articulated for orienting all non-planar surfaces to be processed in suitable alignment with the GCIB 1128 to provide processing optimization and uniformity. More specifically, when the workpiece 1160 being processed is non-planar, the workpiece holder 1202 may be rotated in a rotary motion 1210 and articulated in articulation motion 1212 by an articulation/rotation mechanism 1204. The articulation/rotation mechanism 1204 may permit 360 degrees of device rotation about longitudinal axis 1206 (which is coaxial with the axis 1154 of the GCIB 1128) and sufficient articulation about an axis 1208 perpendicular to axis 1206 to maintain the workpiece surface to within a desired range of beam incidence.

Under certain conditions, depending upon the size of the workpiece 1160, a scanning system may be desirable to produce uniform irradiation of a large workpiece. Although often not necessary for GCIB processing, two pairs of orthogonally oriented electrostatic scan plates 1130 and 1132 may be utilized to produce a raster or other scanning pattern over an extended processing area. When such beam scanning is performed, a scan generator 1156 provides X-axis scanning signal voltages to the pair of scan plates 1132 through lead pair 1159 and Y-axis scanning signal voltages to the pair of scan plates 1130 through lead pair 1158. The scanning signal voltages are commonly triangular waves of different frequencies that cause the GCIB 1128 to be converted into a scanned GCIB 1148, which scans the entire surface of the workpiece 1160. A scanned beam-defining aperture 1214 defines a scanned area. The scanned beam-defining aperture 1214 is electrically conductive and is electrically connected to the low-pressure vessel 1102 wall and supported by support member 1220. The workpiece holder 1202 is electrically connected via a flexible electrical lead 1222 to a Faraday cup 1216 that surrounds the workpiece 1160 and the workpiece holder 1202 and collects all the current passing through the scanned beam-defining aperture 1214. The workpiece holder 1202 is electrically isolated from the articulation/rotation mechanism 1204 and the Faraday cup 1216 is electrically isolated from and mounted to the low-pressure vessel 1102 by insulators 1218. Accordingly, all current from the scanned GCIB 1148, which passes through the scanned beam-defining aperture 1214 is collected in the Faraday cup 1216 and flows through electrical lead 1224 to the dose processor 1170. In operation, the dose processor 1170 opens the beam gate 1172 to initiate GCIB irradiation of the workpiece 1160. The dose processor 1170 typically integrates GCIB electrical current arriving at the workpiece 1160 and workpiece holder 1202 and Faraday cup 1216 to calculate an accumulated GCIB irradiation dose per unit area. At a predetermined dose, the dose processor 1170 closes the beam gate 1172, terminating processing when the predetermined dose has been achieved. During the accumulation of the predetermined dose, the workpiece 1160 may be manipulated by the articulation/rotation mechanism 1204 to ensure processing of all desired surfaces.

Figure 3:
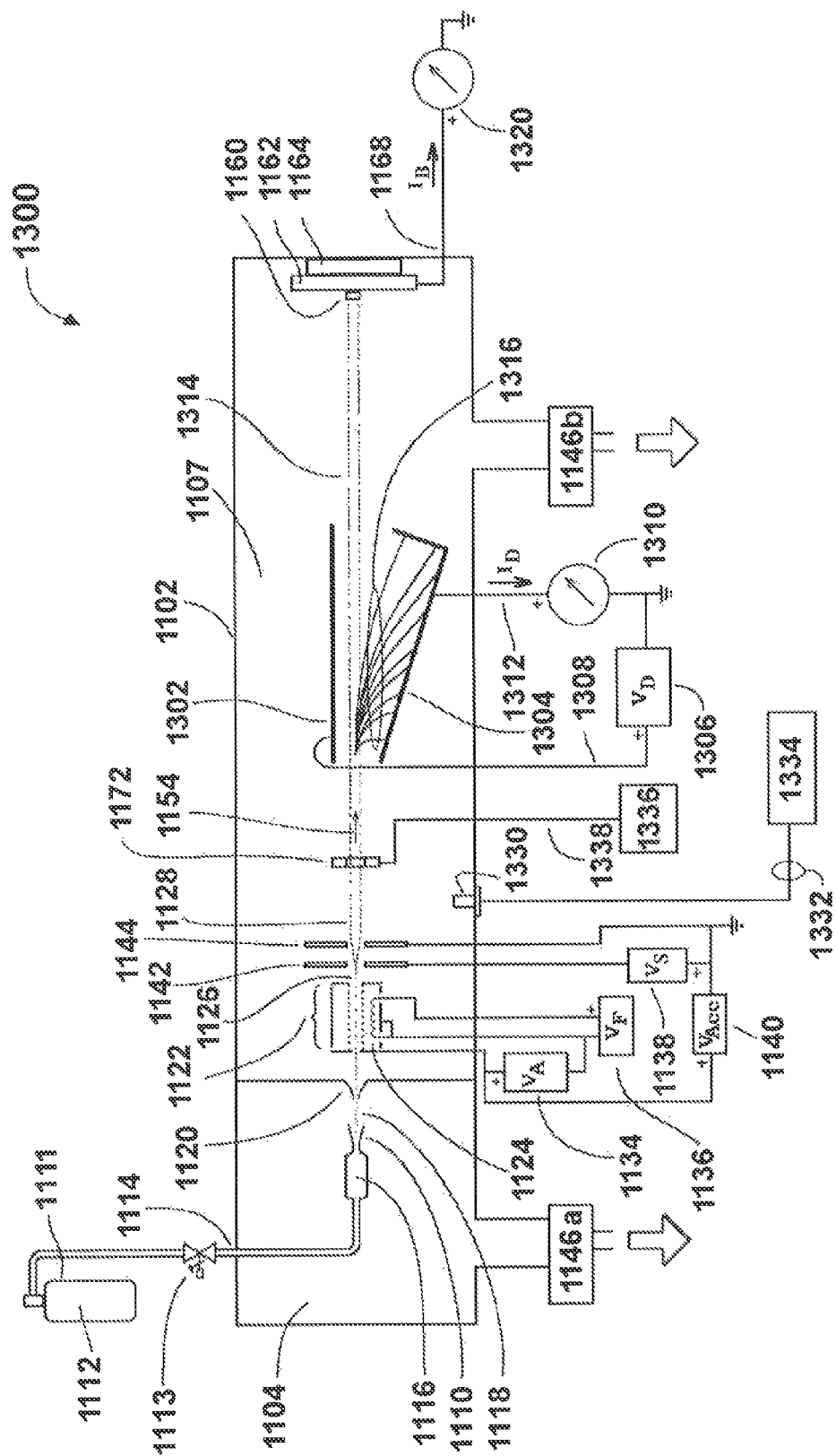
FIG. 3 is a schematic of a Neutral Beam processing apparatus 1300 according to an embodiment of the invention, which uses electrostatic deflection plates to separate the charged and uncharged beams.

FIG. 3 is a schematic of a Neutral Beam processing apparatus 1300 of an exemplary type that may be employed for Neutral Beam processing according to embodiments of the invention. It uses electrostatic deflection plates to separate the charged and uncharged portions of a GCIB, A beamline chamber 1107 encloses the ionizer and accelerator regions and the workpiece processing regions. The beamline chamber 1107 has high conductance and so the pressure is substantially uniform throughout. A vacuum pump 1146b evacuates the beamline chamber 1107. Gas flows into the beamline chamber 1107 in the form of clustered and unclustered gas transported by the gas jet 1118 and in the form of additional unclustered gas that leaks through the gas skimmer aperture 1120. A pressure sensor 1330 transmits pressure data from the beamline chamber 1107 through an electrical cable 1332 to a pressure sensor controller 1334, which measures and displays pressure in the beamline chamber 1107. The pressure in the beamline chamber 1107 depends on the balance of gas flow into the beamline chamber 1107 and the pumping speed of the vacuum pump 1146b. By selection of the diameter of the gas skimmer aperture 1120, the flow of source gas 1112 through the nozzle 1110, and the pumping speed of the vacuum pump 1146b, the pressure in the beamline chamber 1107 equilibrates at a pressure, $P_B$, determined by design and by nozzle flow. The beam flight path from grounded electrode 1144 to workpiece holder 1162, is for example, 100 cm. By design and adjustment may be approximately $6 \times 10^{-5}$ Torr ($8 \times 10^{-3}$ pascal). Thus the product of pressure and beam path length is approximately $6 \times 10^{-3}$ Torr-cm (0.8 pascal-cm) and the gas target thickness for the beam is approximately $1.94 \times 10^{14}$ gas molecules per $cm^2$, which is observed to be effective for dissociating the gas cluster ions in the GCIB 1128. $V_{Acc}$ may be for example 30 kV and the GCIB 1128 is accelerated by that potential. A pair of deflection plates (1302 and 1304) is disposed about the axis 1154 of the GCIB 1128. A deflector power supply 1306 provides a positive deflection voltage $V_D$ to deflection plate 1302 via electrical lead 1308. Deflection plate 1304 is connected to electrical ground by electrical lead 1312 and through current sensor/display 1310. Deflector power supply 1306 is manually controllable, $V_D$ may be adjusted from zero to a voltage sufficient to completely deflect the ionized portion 1316 of the GCIB 1128 onto the deflection plate 1304 (for example a few thousand volts). When the ionized portion 1316 of the GCIB 1128 is deflected onto the deflection plate 1304, the resulting current, $I_D$ flows through electrical lead 1312 and current sensor/display 1310 for indication. When $V_D$ is zero, the GCIB 1128 is undeflected and travels to the workpiece 1160 and the workpiece holder 1162. The GCIB beam current $I_B$ is collected on the workpiece 1160 and the workpiece holder 1162 and flows through electrical lead 1168 and current sensor/display 1320 to electrical ground, $I_B$ is indicated on the current sensor/display 1320. A beam gate 1172 is controlled through a linkage 1338 by beam gate controller 1336. Beam gate controller 1336 may be manual or may be electrically or mechanically timed by a preset value to open the beam gate 1172 for a predetermined interval, in use, $V_D$ is set to zero, the beam current, $I_B$, striking the workpiece holder is measured. Based on previous experience for a given GCIB process recipe, an initial irradiation time for a given process is determined based on the measured current, $I_B$. $V_D$ is increased until all measured beam current is transferred from $I_B$ to $I_D$ and $I_D$ no longer increases with increasing $V_D$. At this point a Neutral Beam 1314 comprising energetic dissociated components of the initial GCIB 1128 irradiates the workpiece holder 1162. The beam gate 1172 is then closed and the workpiece 1160 placed onto the workpiece holder 1162 by conventional workpiece loading means (not shown). The beam gate 1172 is opened for the predetermined initial radiation time. After the irradiation interval, the workpiece may be examined and the processing time adjusted as necessary to calibrate the duration of Neutral Beam processing based on the measured GCIB beam current $I_B$. Following such a calibration process, additional workpieces may be processed using the calibrated exposure duration.

The Neutral Beam 1314 contains a repeatable fraction of the initial energy of the accelerated GCIB 1128. The remaining ionized portion 1316 of the original GCIB 1128 has been removed from the Neutral Beam 1314 and is collected by the grounded deflection plate 1304. The ionized portion 1316 that is removed from the Neutral Beam 1314 may include monomer ions and gas cluster ions including intermediate size gas cluster ions. Because of the monomer evaporation mechanisms due to cluster heating during the ionization process, intra-beam collisions, background gas collisions, and other causes (all of which result in erosion of clusters) the Neutral Beam substantially consists of neutral monomers, while the separated charged particles are predominately cluster ions. The inventors have confirmed this by suitable measurements that include re-ionizing the Neutral Beam and measuring the charge to mass ratio of the resulting ions.

Figure 4:
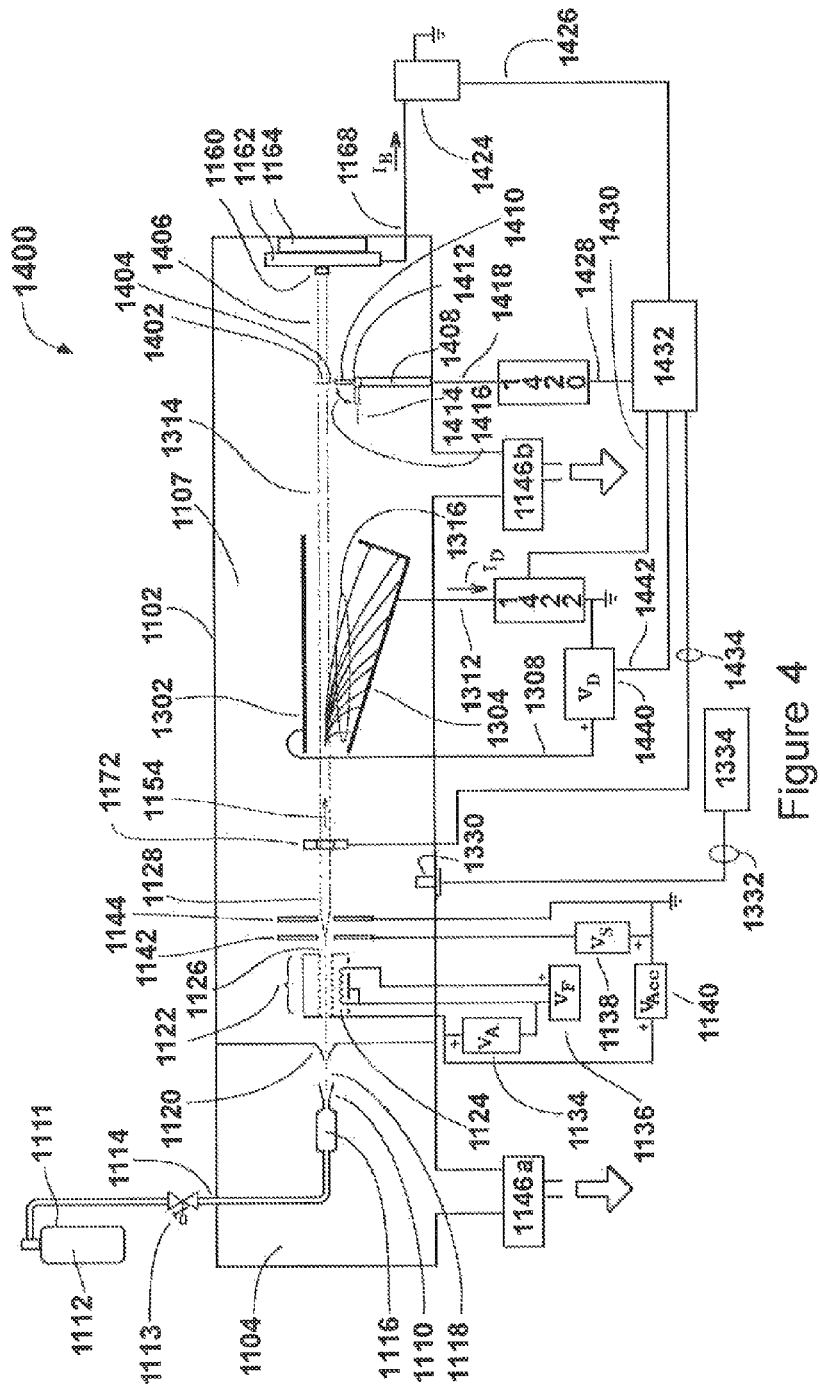
FIG. 4 is a schematic of a Neutral Beam processing apparatus 1400 according to an embodiment of the invention, using a thermal sensor for Neutral Beam measurement.

FIG. 4 shows a schematic of a Neutral Beam processing apparatus 1400 as may, for example, be used in generating Neutral Beams as may be employed in embodiments of the invention. It uses a thermal sensor for Neutral Beam measurement. A thermal sensor 1402 attaches via low thermal conductivity attachment 1404 to a rotating support arm 1410 attached to a pivot 1412. Actuator 1408 moves thermal sensor 1402 via a reversible rotary motion 1416 between positions that intercept the Neutral Beam 1314 or GCIB 1128 and a parked position indicated by 1414 where the thermal sensor 1402 does not intercept any beam. When thermal sensor 1402 is in the parked position (indicated by 1414) the GCIB 1128 or Neutral Beam 1314 continues along path 1406 for irradiation of the workpiece 1160 and/or workpiece holder 1162. A thermal sensor controller 1420 controls positioning of the thermal sensor 1402 and performs processing of the signal generated by thermal sensor 1402. Thermal sensor 1402 communicates with the thermal sensor controller 1420 through an electrical cable 1418. Thermal sensor controller 1420 communicates with a dosimetry controller 1432 through an electrical cable 1428. A beam current measurement device 1424 measures beam current $I_B$ flowing in electrical lead 1168 when the GCIB 1128 strikes the workpiece 1160 and/or the workpiece holder 1162. Beam current measurement device 1424 communicates a beam current measurement signal to dosimetry controller 1432 via electrical cable 1426. Dosimetry controller 1432 controls setting of open and closed states for beam gate 1172 by control signals transmitted via linkage 1434. Dosimetry controller 1432 controls deflector power supply 1440 via electrical cable 1442 and can control the deflection voltage $V_D$ between voltages of zero and a positive voltage adequate to completely deflect the ionized portion 1316 of the GCIB 1128 to the deflection plate 1304. When the ionized portion 1316 of the GCIB 1128 strikes deflection plate 1304, the resulting current $I_D$ is measured by current sensor 1422 and communicated to the dosimetry controller 1432 via electrical cable 1430. In operation dosimetry controller 1432 sets the thermal sensor 1402 to the parked position 1414, opens beam gate 1172, sets $V_D$ to zero so that the full GCIB 1128 strikes the workpiece holder 1162 and/or workpiece 1160. The dosimetry controller 1432 records the beam current $I_B$ transmitted from beam current measurement device 1424. The dosimetry controller 1432 then moves the thermal sensor 1402 from the parked position 1414 to intercept the GCIB 1128 by commands relayed through thermal sensor controller 1420. Thermal sensor controller 1420 measures the beam energy flux of GCIB 1128 by calculation based on the heat capacity of the sensor and measured rate of temperature rise of the thermal sensor 1402 as its temperature rises through a predetermined measurement temperature (for example 70 degrees C.) and communicates the calculated beam energy flux to the dosimetry controller 1432 which then calculates a calibration of the beam energy flux as measured by the thermal sensor 1402 and the corresponding beam current measured by the beam current measurement device 1424. The dosimetry controller 1432 then parks the thermal sensor 1402 at parked position 1414, allowing it to cool and commands application of positive $V_D$ to deflection plate 1302 until all of the current $I_D$ due to the ionized portion of the GCIB 1128 is transferred to the deflection plate 1304. The current sensor 1422 measures the corresponding $I_D$ and communicates it to the dosimetry controller 1432. The dosimetry controller also moves the thermal sensor 1402 from parked position 1414 to intercept the Neutral Beam 1314 by commands relayed through thermal sensor controller 1420. Thermal sensor controller 1420 measures the beam energy flux of the Neutral Beam 1314 using the previously determined calibration factor and the rate of temperature rise of the thermal sensor 1402 as its temperature rises through the predetermined measurement temperature and communicates the Neutral Beam energy flux to the dosimetry controller 1432. The dosimetry controller 1432 calculates a neutral beam fraction, which is the ratio of the thermal measurement of the Neutral Beam 1314 energy flux to the thermal measurement of the full GCIB 1128 energy flux at thermal sensor 1402. Under typical operation, a neutral beam fraction of from about 5% to about 95% is achieved. Before beginning processing, the dosimetry controller 1432 also measures the current, $I_D$, and determines a current ratio between the initial values of $I_B$ and $I_D$. During processing, the instantaneous $I_D$ measurement multiplied by the initial $I_B/I_D$ ratio may be used as a proxy for continuous measurement of the $I_B$ and employed for dosimetry during control of processing by the dosimetry controller 1432. Thus the dosimetry controller 1432 can compensate any beam fluctuation during workpiece processing, just as if an actual beam current measurement for the full GCIB 1128 were available. The dosimetry controller uses the neutral beam fraction to compute a desired processing time for a particular beam process. During the process, the processing time can be adjusted based on the calibrated measurement of $I_D$ for correction of any beam fluctuation during the process.

Figure 5:
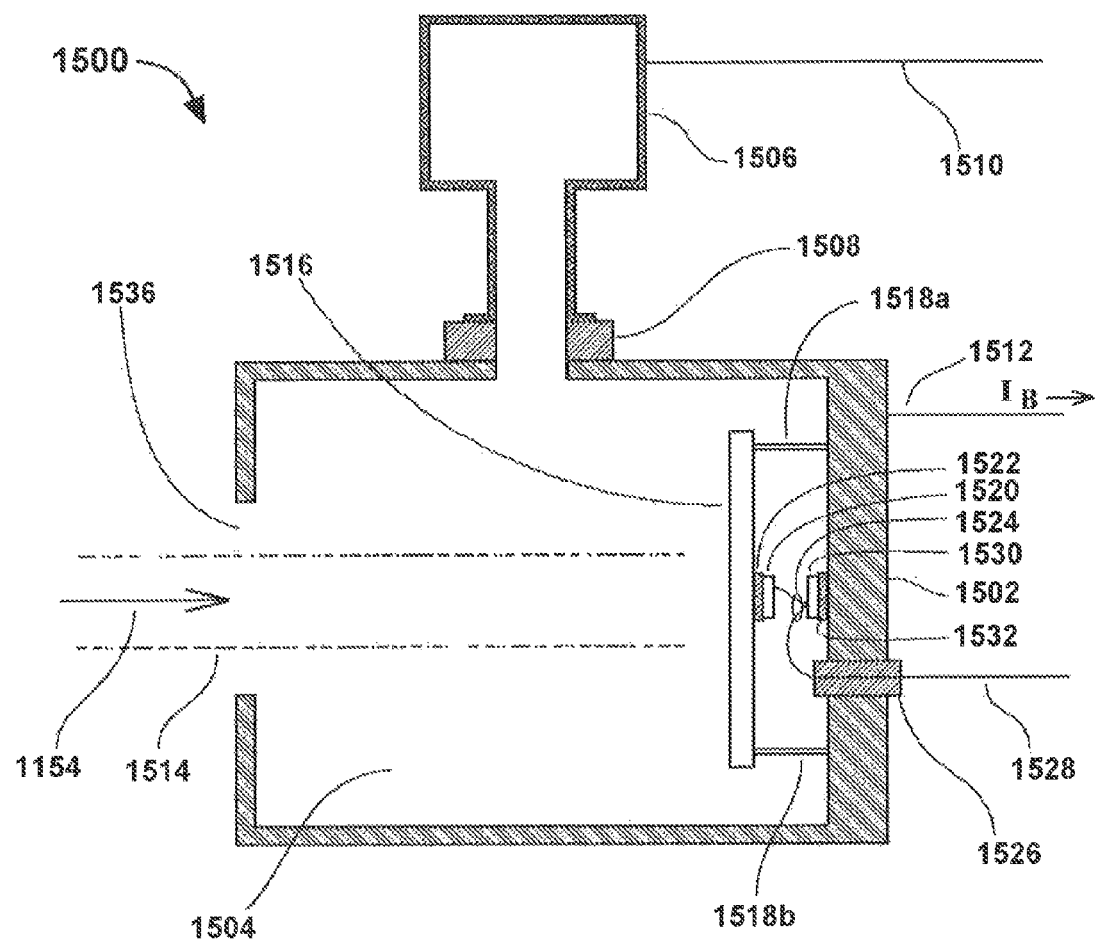
FIG. 5 is a schematic of a sensor apparatus 1500 for Neutral Beam diagnostics and measurement according to an embodiment of the invention.

FIG. 5 is a schematic of a sensor apparatus 1500 for Neutral Beam diagnostics and measurement according to an embodiment of the invention. The sensor apparatus 1500 has multiple sensors and may be used to measure characteristics of either an ion beam or a neutral beam. In use, it is aligned with the axis 1154 of a beam 1514. Beam 1514 may be, for example, a GCIB, a Neutral Beam, or a Dissociated Neutral Beam. The body of sensor apparatus 1500 is a Faraday cup 1502, having an interior 1504 and an entrance aperture 1536. Beam 1514 enters the Faraday cup 1502 through entrance aperture 1536 and is incident on strike plate 1516. The metal strike plate 1516 is electrically and thermally conductive and has a heat capacity. The strike plate 1516 is electrically and thermally connected to the Faraday cup 1502 that forms the body of the sensor apparatus 1500 by one or more electrically and thermally conductive support(s) 1518a and 1518b (two shown for example, not limitation; hereinafter reference numbers 1518a and 1518b are taken to represent one or more support(s)). Support(s) 1518a and 1518b are metal and is designed to have low electrical resistance and a moderate thermal resistance (referring to the parallel connection of all of the one or more supports) and also serve to mechanically support the strike plate 1516. In comparison to the one or more support(s) 1518a and 1518b, the strike plate 1516 and the Faraday cup 1502 both have very high thermal conductivity. Preferably the portion of the Faraday cup 1502 to which the support(s) 1518a and 1518b attach is thermally massive so as to have a capacity to absorb heat with little temperature change. The exterior of the Faraday cup 1502 may be exposed to atmosphere and thus benefit from atmospheric cooling thereby. Optionally, not shown, the Faraday cup 1502 may be actively cooled or temperature regulated to maintain its temperature at a fixed temperature, for example 25 degrees Celsius. The beam 1514 entering through the entrance aperture 1536 is incident on the strike plate 1516. Utile beam 1514 comprises ions (GCIB), then the beam current, collected by the strike plate 1516 and the Faraday cup 1502 and may be conducted through electrical lead 1512 to an external beam current measurement system. If the beam 1514 is a Neutral Beam Dissociated Neutral Beam, zero beam current, $I_B$, is collected. Thus the Faraday cup function of the sensor apparatus 1500 is not required for Neutral Beam or Dissociated Neutral Beam measurement and characterization and electrical lead 1512 and associated apparatus for measuring beam current $I_B$ is not required. The description herein assumes that it may be desired that the same apparatus be capable of measuring a beam comprising ions, and thus describes the (optional) Faraday cup function and beam current measuring functions of the sensor apparatus 1500. The kinetic energy of the beam 1514 is dissipated in the strike plate 1516 and converted to heat, elevating the temperature of the strike plate 1516. Heat from the elevated temperature strike plate flows through the one or more support(s) 1518a, 1518b to the Faraday cup 1502 body of the sensor apparatus 1500, creating a temperature drop across the support(s) 1518a and 1518b. A temperature sensor 1520, which is typically a thermocouple or thermopile (but may be another sensor type, such as thermistor or RTD) is thermally connected to but electrically insulated from the strike plate 1516 by an electrically insulating adhesive layer 1522. Another temperature sensor 1530, which is typically a thermocouple (but may be another sensor type, such as thermistor, thermopile, or RTD) is thermally connected to but electrically insulated from the Faraday cup 1502 body of the sensor apparatus 1500 by an electrically insulating adhesive layer 1532. In one exemplary configuration, temperature sensor 1520 is the hot junction of a thermocouple or thermopile, and temperature sensor 1530 is the cold junction of the same thermocouple or thermopile. An electrical cable 1524 that has a thermal conductivity that is negligible in comparison to that of the support 1518 connects temperature sensors 1520 and 1530 through an electrically insulating feedthrough 1526 to external cable 1528 to transmit temperature information from the two temperature sensors to an external measurement system. The equilibrium difference in temperature measured by temperature sensor 1520 and temperature sensor 1530 is a measure of the power dissipated in the strike plate 1516 due to the incidence of the energetic beam 1514. The heat capacity of the strike plate 1516 and the thermal resistance of (referring to the parallel connection of all of the one or more) the support(s) 1518a and 1518b determine the time constant of the temperature transient that occurs when beam 1514 dissipates its kinetic energy in the strike plate 1516—that, time constant is typically chosen by design to be from a small fraction of a second to a few seconds, as desired. The beam 1514 transmits mass into the interior 1504 of the Faraday cup 1502. Any gas clusters or gas cluster ions that may be in the beam 1514 become fully dissociated upon their incidence on the strike plate 1516 and along with any monomers that may be in the beam 1514, are released into the interior 1504 of the Faraday cup 1502, raising the pressure in the interior 1504 of the Faraday cup 1502. A pressure transducer 1506 fluidly communicates with the interior 1504 of the Faraday cup 1502 and is attached thereto with an electrically insulating flange 1508. The pressure transducer 1506 measures the pressure in the interior 1504 of the Faraday cup 1502. The pressure in the interior 1504 of the Faraday cup 1502 is a measure of the mass flow into the Faraday cup 1502 due to the beam 1514. In operation the sensor apparatus 1500 operates with the interior 1504 of the Faraday cup 1502 under vacuum conditions. The beam power measurement function of the sensor apparatus 1500 may be calibrated by placing the sensor apparatus 1500 under vacuum conditions and directing an infrared laser beam of known beam power (or other calibrated radiative power source) onto the strike plate (to simulate power dissipation due to an accelerated beam).

Figure 6:
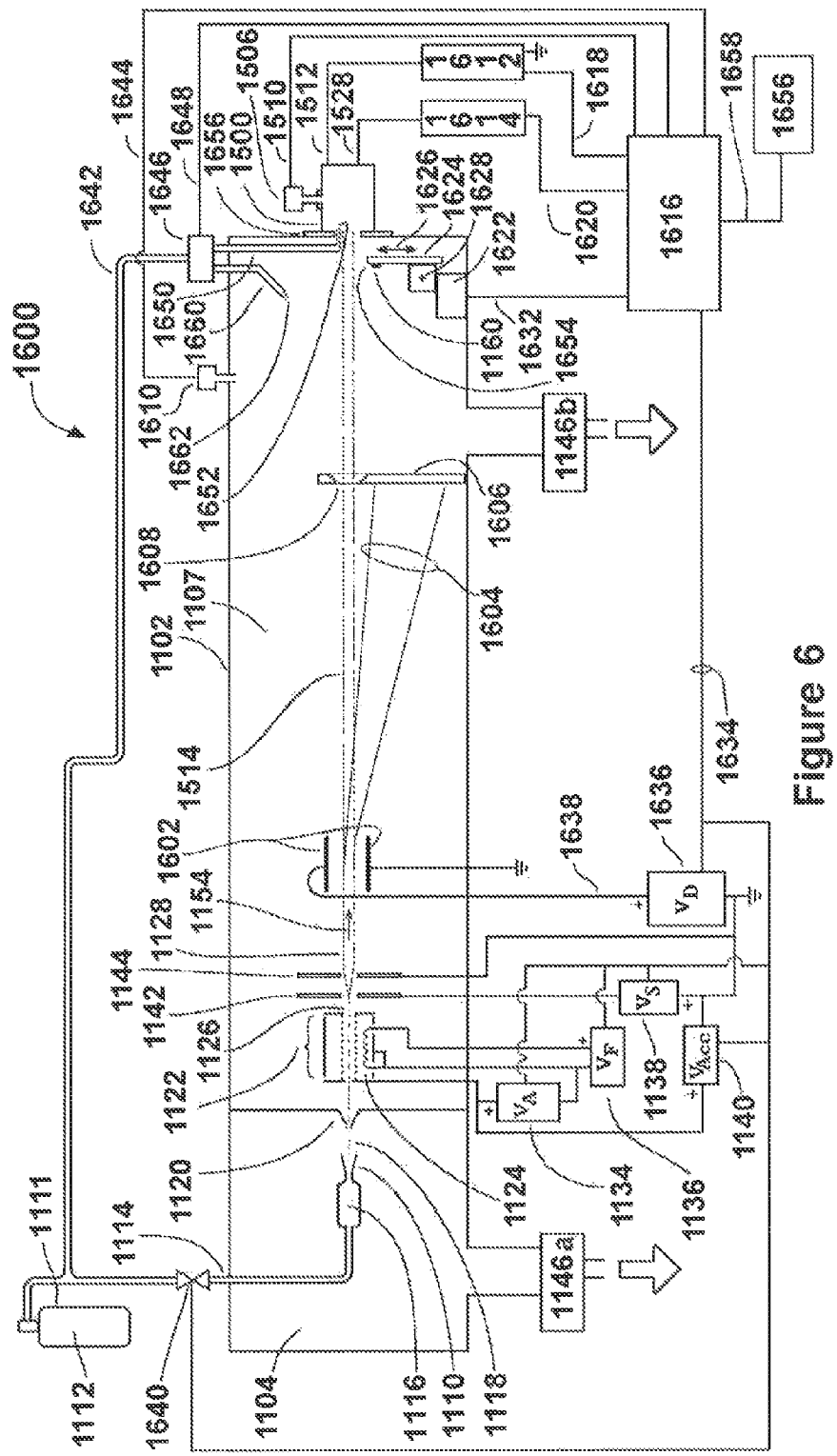
FIG. 6 is a schematic of a Neutral Beam processing apparatus 1600 according to an embodiment of the invention, using for Neutral Beam diagnostics and measurement and shown in a beam diagnostic configuration.

FIG. 6 is a schematic of a Neutral Beam processing apparatus 1600 according to an embodiment of the invention, using the sensor apparatus 1500 for Neutral Beam diagnostics and measurement and shown in a beam diagnostic configuration. A sensor apparatus 1500 is disposed coaxially with the axis 1154 of the beam 1514. The sensor apparatus is attached to the beamline chamber 1107 of the low-pressure vessel 1102 with an electrically insulating flange 1656 at an opening that permits transmission of the beam 1514 into the sensor apparatus 1500. An accelerated GCIB 1128 is generated. A pair of electrostatic deflection plates 1602 is disposed about the axis 1154. A deflection power supply 1636 provides a controllable deflection voltage, $V_D$. An electrical lead 1638 applies deflection voltage, $V_D$, between the deflection plates 1602. When $V_D$ is zero, the downstream beam 1514 is the GCIB 1128. When $V_D$ is sufficiently large (dependent on beam energy and deflection plate geometry, but typically a few kV), the ionized portion 1604 of the GCIB 1128 is deflected, and beam 1514 is a Neutral Beam. A beam dump 1606 is positioned to receive the ionized portion 1604 of the beam when deflected by the deflection plates 1602. Beam dump 1606 has an aperture 1608 for passing beam 1514. When $V_D$ is zero, aperture 1608 transmits a beam 1514 that is a GCIB. When $V_D$ is sufficiently large, the ionized portion 1604 strikes the beam dump 1606 and the aperture 1608 transmits a Neutral Beam. When beam 1514 is a Neutral Beam, it contains both accelerated components and non-accelerated components. A portion of the gas jet 1118 is typically transmitted through the ionizer 1122 without being ionized and is thus not accelerated in the extraction region between the ionizer exit aperture 1126 and the suppressor electrode 1142. Such un-accelerated portion of the gas jet may contain monomers and gas clusters, traveling at gas jet velocity, which is supersonic. Typically the un-accelerated monomers and/or clusters have energies on the order of a few milli-electron-volts per monomer and thus normally do not result in any significant surface processing when they impact a workpiece. However, these particles do participate in the transport of mass along the beam 1514, and into the sensor apparatus 1500. Since these low energy (un-accelerated) components of the Neutral Beam do not significantly participate in workpiece processing, they should be excluded from the dosimetry calculations for the accelerated Neutral Beam.

A controller 1616 may be a general-purpose controller (such as a microprocessor-based controller) and is used to calibrate the beam measurement system, to control dosimetry during workpiece processing, and to report beam diagnostic information to a user/operator.

A pressure transducer 1610 is located in the beamline chamber 1107 at a position off-axis from the beam 1514. Electrical lead 1512 conducts the beam current, $I_B$, to a beam current measuring device 1612 that measures $I_B$ and transmits the measurement via electrical cable 1618 to controller 1616. Electrical cable 1528 transmits temperature measurement information to a temperature measurement device 1614 that measures the temperature difference across the one or more support(s) 1518a and 1518b and transmits the temperature difference measurement through electrical cable 1620 to controller 1616. Pressure sensor 1506 measures the pressure in the interior of the sensor apparatus 1500 and transmits pressure measurement information to controller 1616 via electrical cable 1510. Pressure transducer 1610 measures the pressure in the beamline chamber 1107 and transmits it to controller 1616 via electrical cable 1644. A pressurized condensable source gas 1112 (for example argon) stored in a gas storage cylinder 1111 flows through a gas metering and shut-off valve 1640 and a feed tube 1114 into a stagnation chamber 1116 for ejection through nozzle 1116 to form gas jet 1118. A two-way gas metering and shut-off valve 1646 connects source gas 1112 to either feed tube 1650 or feed tube 1660. The two-way gas metering and shut-off valve 1646 can shut off the gas flow, or regulate the gas flow to a controllable flow rate delivered to either of feed tube 1650 or feed tube 1660. Feed tube 1650 has a nozzle 1652 that directs a controlled flow of metered source gas 1112 into the interior of the sensor apparatus 1500 for calibration purposes. Feed tube 1660 has a nozzle 1662 that directs a controlled flow of metered source gas 1112 into the beamline chamber 1107. The two-way gas metering and shut-off valve 1646 receives control signals from controller 1616 via cable 1648 to meter a controlled flow of source gas flow into either the sensor apparatus 1500 or into the beamline chamber 1107 or to shut off flow completely.

A workpiece manipulator 1622 controls a workpiece holder 1624 that holds a workpiece 1160. A workpiece 1160 may be placed onto or removed from the workpiece holder 1624 (or an unprocessed workpiece exchanged for a processed workpiece) by conventional workpiece loading/unloading means (not shown). Workpiece manipulator 1622 can mechanically extend or retract the workpiece holder 1624 and the workpiece 1160 with a linear motion 1626. This permits placing the workpiece 1160 into the beam 1514 or retracting it from the beam 1514 to initiate or stop beam processing of the workpiece 1160. Workpiece holder is shown in its retracted position 1654, with the workpiece out of the beam 1514 as is suitable when performing beam diagnostics. Workpiece manipulator 1622 may optionally have an additional motion axis 1628 that is into and out of the plane of the paper in FIG. 6 and orthogonal to the motion 1626. The combination of motions 1626 and 1628 facilitates scanning of the workpiece through the beam 1514 when scanning is desirable to provide uniform processing of large area workpieces. Controller 1616 provides control signals via electrical cable 1632 to workpiece manipulator 1622 to control extension and retraction of the workpiece with respect to the beam 1514, and optionally to control scanning of the workpiece 1160 through the beam 1514 when desired. Controller 1616 transmits control signals via electrical communication and control bus 1634 to deflection power supply 1636 to adjust deflection voltage, $V_D$, to control deflection of the ionized portion 1604 out of the beam 1514. Controller 1616 transmits control signals via electrical communication and control bus 1634 to suppression power supply 1138 to turn on or off suppression voltage, $V_S$. Controller 1616 transmits control signals via electrical communication and control bus 1634 to accelerator power supply 1140 to turn on or off acceleration voltage, $V_{Acc}$. Controller 1616 transmits control signals via electrical communication and control bus 1634 to deflection power supply 1636 to adjust deflection voltage, $V_D$, to control deflection of the ionized portion 1604 out of the beam 1514. Controller 1616 transmits control signals via electrical communication and control bus 1634 to filament power supply 1136 to adjust or turn on or off filament voltage, $V_F$. Controller 1616 transmits control signals via electrical communication and control bus 1634 to anode power supply 1134 to adjust or turn on or off anode voltage, $V_A$. Controller 1616 transmits control signals via electrical communication and control bus 1634 to gas metering and shut-off valve 1640 to control or shut-off flow of source gas 1112 to stagnation chamber 1116 to initiate or terminate formation of gas jet 1118. A display device 1656 is controlled by controller 1616 via electrical cable 1658 and provides display of beam diagnostic information to a user/operator.

In use, the system is calibrated by calibrating the beam power measurement as previously described and the power sensitivity (in kelvins/mW) is recorded as $k_A$ (for example 0.05 kelvins/mW.)

The beam mass transport measurement is calibrated by placing the beamline chamber under its normal operating vacuum without beam generation (gas metering valve 1113 closed). Gas valve 1640 is opened. Controller 1616 commands mass flow controller 1646 to introduce source gas (typically argon) into the sensor apparatus 1500 via feed tube 1650 and nozzle 1652. For a range of flows, for example 0-1 standard cubic centimeter per minute (std $cm^3$/min) also (sccm), a linear pressure measurement curve is measured and the slope of the linear curve determined and recorded as $k_D$ (for example $1.2 \times 10^{-3}$ Torr/sccm.) (Note that 1 pascal meter$^3$/ sec is approximately 592.2 sccm; and 1 Torr/sccm is approximately 7.892 sec/meter$^3$) Controller 1616 commands mass flow controller 1646 to zero flow.

Figure 7:
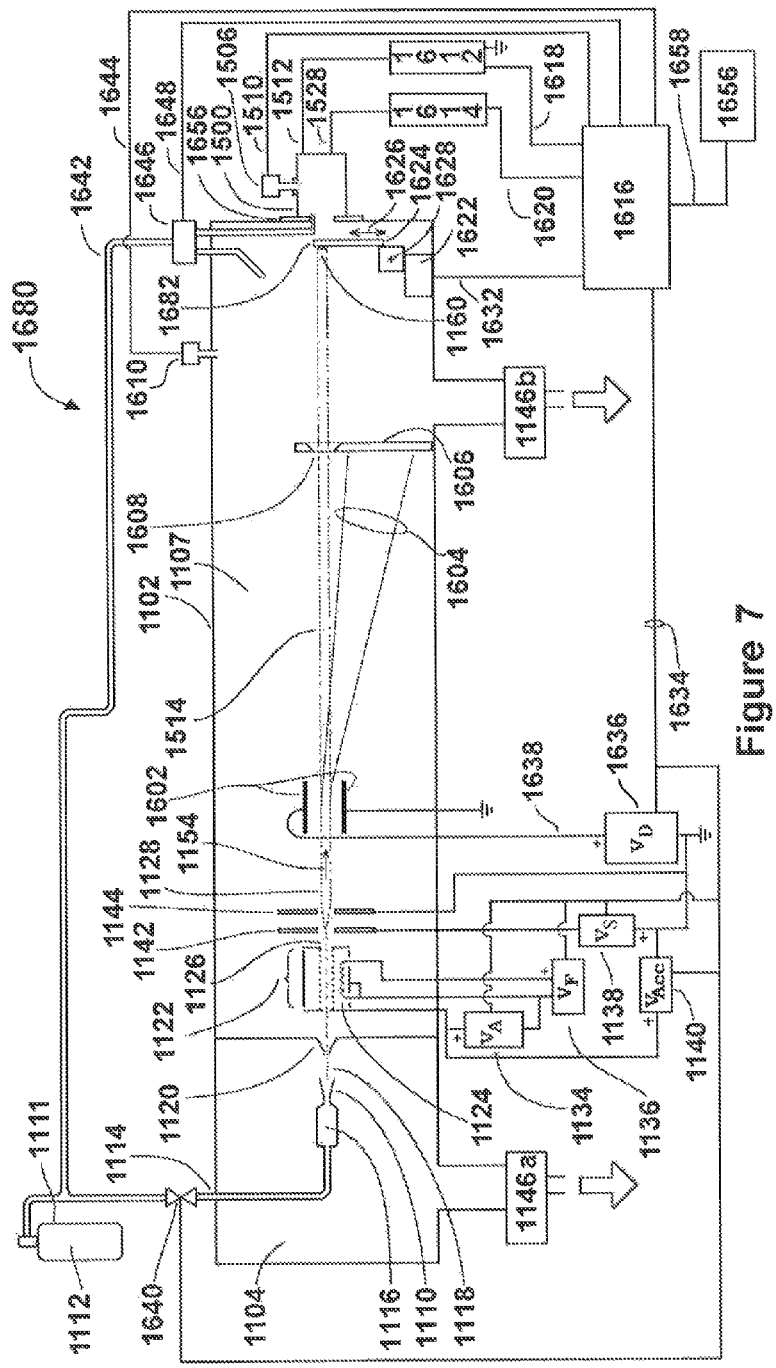
FIG. 7 is a schematic of a Neutral Beam processing apparatus 1680 according to an embodiment of the invention, using for Neutral Beam diagnostics and measurement, and shown in a workpiece processing configuration.

FIG. 7 is a schematic 1680 showing the Neutral Beam processing apparatus 1600 previously described, and shown in a Neutral Beam workpiece-processing configuration. Controller 1616 commands gas metering and shut-off valve 1640, anode power supply 1134, filament power supply 1136, accelerator power supply 1140, and suppression power supply 1138 to establish conditions for forming a GCIB 1128 according to the beam parameters (beam current and acceleration voltage, etc. previously determined as suitable the desired processing) through control signals sent via communication and control bus 1634. Controller 1616 also transmits control signals via electrical communication and control bus 1634 to deflection power supply 1636 to adjust deflection voltage, $V_D$, to deflect the ionized portion 1604 of the GCIB 1128 out of the beam 1514 so that beam 1514 is a Neutral Beam. Controller 1616 transmits control signals to workpiece manipulator 1622 via electrical cable 1632 to cause an unprocessed workpiece 1160 to be moved into the beam 1514 by moving workpiece holder 1624 to extended position, 1682. If desired, workpiece manipulator 1622 may be controlled by controller 1616 to scan the workpiece 1160 through the beam 1514 to enable uniform processing of the workpiece 1160 when the workpiece 1160 is larger than the diameter of the beam 1514. Using beam characterization information determined during previous beam characterization measurements (described herein below—see calculations $C_P$ and $C_S$ below) the controller 1616 determines total time required for exposure (scanned or un-scanned) of the workpiece 1160 to the beam 1514 to achieve a preselected desired dose of neutral beam processing (total dose of accelerated neutral molecules per cm$^2$ at the workpiece surface.) At the attainment of preselected desired dose at the workpiece 1160, controller 1616 commands workpiece manipulator 1622 to remove workpiece 1160 from the beam 1514 to terminate processing of the workpiece 1160. A conventional workpiece loading/unloading means (not shown) may remove the processed workpiece 1160 from the processing apparatus and replace it with another unprocessed workpiece for additional processing.

Although the sensor apparatus 1500 has been illustrated in FIGS. 6 and 7 as attached to the exterior of the low pressure vessel 1102 for exemplary purposes, it will be clear to those skilled in the art that the sensor apparatus 1500 could alternatively be disposed partially or entirely inside the beamline chamber 1107. It could also be disposed upstream of the workpiece holder 1624 by arranging suitable mechanisms and controls to move the sensor apparatus into the beam 1514 for beam characterization or out of the beam for permitting processing. If disposed partially or entirely inside the beamline chamber 1107, corresponding appropriate changes to the position of nozzle 1652 may be necessary, and provision of suitable cooling or temperature regulation of the portion of the Faraday cup 1502 to which the support(s) 1518a and 1518(*b*) attach may be necessary to prevent overheating of the sensor apparatus 1500 and to insure proper operation in a vacuum environment.

The apparatus illustrated in FIGS. 5 and 6 is capable of a comprehensive characterization of a Neutral Beam or Dissociated Neutral Beam and (optionally, by measuring beam current $I_B$ with a Faraday cup) the GCIB from which it is derived. According to the following methods, initially certain system constants are determined and then several variables related to each specific beam set-up are determined. From the measured system constants and the set-up specific variables, a comprehensive beam characterization may be calculated and utilized for, among other purposes, dosimetry during Neutral Beam or Dissociated Neutral Beam processing of a workpiece. Collectively, the strike plate 1516, the one or more support(s) 1518a and 1518b for examples, the body of the Faraday cup 1502, the temperature sensors 1520 and 1530, temperature measurement device 1614, and the controller 1616 together with their electrical interconnections constitute a "Beam Power Meter" for measuring power of the beam 1514 through its thermal effects on the strike plate 1516. The sensitivity of the Beam Power Meter in kelvins/mW is represented as $k_A$, where the beam power dissipated in the strike plate 1516 is expressed in mW and the resulting equilibrium temperature difference between temperatures measured at temperature sensors 1520 and 1530 is expressed in kelvins. The sensitivity of the pressure transducer 1506 to gas transported into the sensor apparatus 1500 by the beam 1514 in Torr/sccm is represented by $k_D$, where the amount of gas transported is expressed in sccm (for the dissociated beam or for the calibration gas source introduced through nozzle 1652) and the pressure measured by the pressure transducer 1506 is expressed in Torr (note that: 1 Torr/sccm is approximately 7.892 sec/meter$^3$; and 1 pascal is approximately 0.007501 Torr; and 1 pascal meter$^3$/sec is approximately 592.2 sccm). The sensitivity of the pressure transducer 1506 to background gas pressure in the sensor apparatus 1500 with gas flow into the beamline chamber 1107 due to the gas jet 1118 in units of Torr/sccm is represented by $k_B$, where the amount of gas supplied through the nozzle 1110 is expressed in sccm (or for the calibration gas source introduced through nozzle 1662) and the pressure measured by the pressure transducer 1506 is expressed in units of Torr (note that: 1 Torr/sccm is approximately 7.892 sec/meter$^3$; and 1 pascal is approximately 0.007501 Torr; and 1 pascal meter/see is approximately 592.2 sccm). The sensitivity of the pressure transducer 1610 to background gas pressure in the in the beamline 1107 with gas flow into the beamline chamber 1107 due to the gas jet 1118 in units of Torr/sccm is represented by $k_C$, where the amount of gas supplied through the nozzle 1110 is expressed in sccm (or for the calibration gas source introduced through nozzle 1662) and the pressure measured by the pressure transducer 1610 is expressed in units of Torr (note that: 1 Torr/sccm is approximately 7.892 sec/meter$^3$; and 1 pascal is approximately 0.007501 Torr; and 1 pascal meter$^3$/sec is approximately 592.2 sccm).

The Beam Power Meter sensitivity, $k_A$, may be measured by placing the sensor apparatus 1500 under vacuum conditions and directing an infrared laser beam of known beam power (or other calibrated radiative power source) onto the strike plate (to simulate power dissipation due to an accelerated beam). For example, an ytterbium fiber laser operating at a wavelength of 1.06 micrometers at a beam power level of 100 milliwatts (calibrated using a laser power meter) may be convenient. When thus calibrated, the relationship between incident power at the strike plate 1516 and the temperature difference between the two temperature sensors 1520 and 1530 (at equilibrium or near equilibrium, for example after about 5 thermal time constants of the Beam Power Meter) is known and can be used to measure incident beam power at the strike plate 1516. In an exemplary configuration of support(s) 1518a and 1518b, the sensitivity, $k_A$, may be, for example, on the order of about 0.5 kelvins/mW.

Figure 8A:
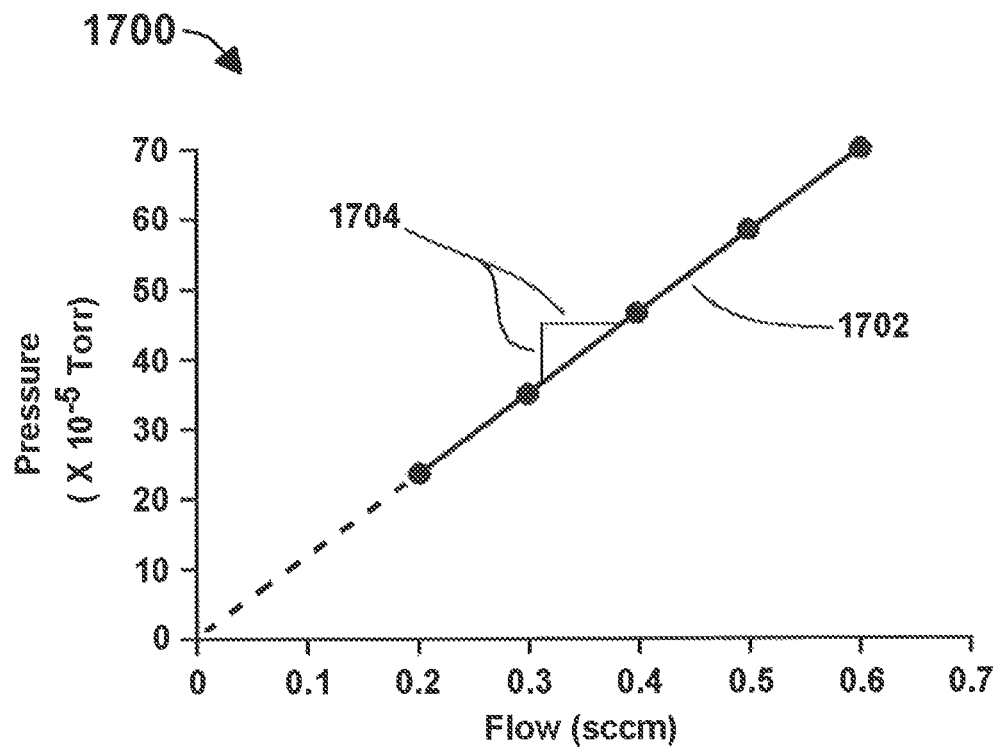
FIGS. 8A and 8B shows an exemplary calibration curve for the pressure transducers generated as part of the methods of the invention.

The sensitivity of the pressure transducer 1506 to gas transported into the sensor apparatus 1500 by the beam 1514 in Torr/sccm is measured by controlled simulation of gas transport by the beam (note that: 1 Torr/sccm is approximately 7.892 sec/meter$^3$). The gas jet 1118 is turned off by closing gas metering and shut-off valve 1640. Then controller 1616 controls two-way gas metering and shut-off valve 1646 to cause a controlled sequence of flows through nozzle 1652 directly into the interior 1504 of the sensor apparatus 1500 to simulate transport of gas into the sensor apparatus 1500 by beam. For example, gas flows of 0.2, 0.3, 0.4, 0.5, and 0.6 sccm (or other sequence of values corresponding to typical beam transport of gas that will likely be experienced for the beam intensities typically employed) may be introduced into the sensor apparatus and the corresponding pressure readings of the pressure transducer 1506 recorded (note that gas flows of 0.2, 0.3, 0.4, 0.5, and 0.6 sccm correspond respectively to approximately $3.378\times10^{-4}$, $5.067\times10^{-4}$, $6.756\times10^{-4}$, $8.445\times10^{-4}$, and $1.013\times10^{-3}$ pascal meter$^3$/sec). FIG. 8A shows an exemplary calibration curve 1700 for the pressure transducer 1506 that may result from such a sequence of measurements. The measurements result in an essentially straight-line curve 1702, having a slope 1704 equal to $k_D$, for example on the order of about $1.2\times10$ Torr/sccm ($9.470\times10^{-3}$ sec/meter$^3$). The controller 1616 performs and stores the measurements, fits a straight-line curve 1702 to the measured data and extracts the slope 1704 and stores it as the calibrated sensitivity, $k_D$ in Torr/sccm (note that: 1 Torr/sccm is approximately 7.892 sec/meter$^3$, for the pressure transducer 1506 to gas transported into the sensor apparatus 1500 by beam 1514 (or by calibration gas flow injected by nozzle 1652.)

Figure 8B:
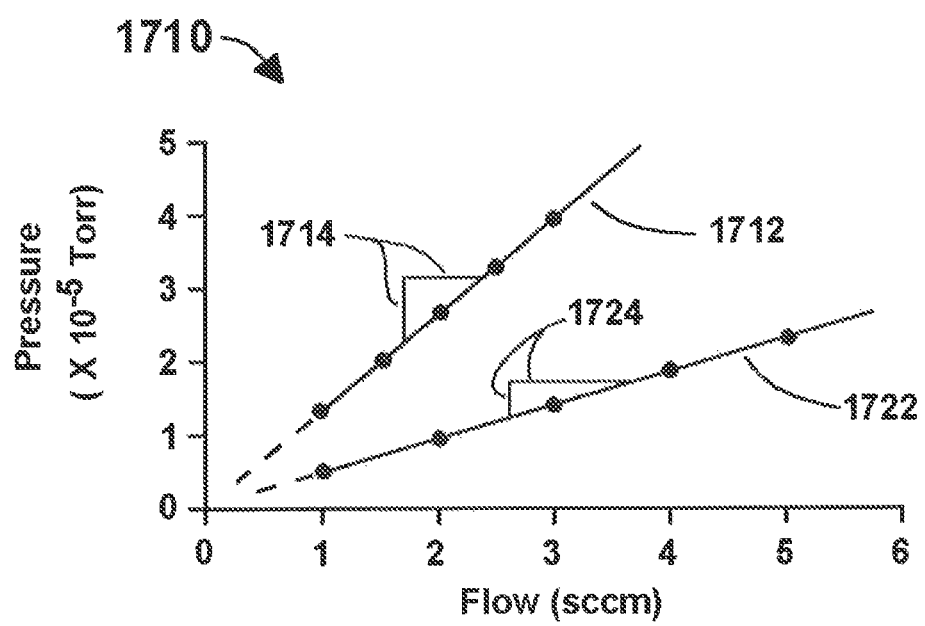

The sensitivity of the pressure transducer 1506 to background gas pressure in the sensor apparatus 1500 resulting from gas flow into the beamline chamber 1107 because of the gas jet 1118 when no beam 1514 is entering the sensor apparatus 1500 is represented by $k_B$ (in units of Torr/sccm, where 1 Torr/sccm is approximately 7.892 sec/meter$^3$). A calibration gas flow is introduced through nozzle 1662 into the beamline chamber 1107 and the resulting pressure measured by the pressure transducer 1506 is expressed in units of Torr (note that: 1 pascal is approximately 0.007501 Torr). For this calibration, the controller 1616 shuts off the gas jet 1118 by closing gas metering and shut-off valve 1640. Then controller 1616 controls two-way gas metering and shut-off valve 1646 to cause a controlled sequence of flows through nozzle 1662 directly into the beamline chamber 1107 to simulate flow of gas into the beamline chamber 1107 due to the gas jet 1118. For example, gas flows of 1, 1.5, 2, 2.5, and 3 sccm (or other sequence of values corresponding to typical gas flow into the beamline chamber 1107 due to the gas jet 1118 and any resulting beams during typical operation of the system) may be introduced into the beamline chamber 1107 under control of controller 1616 (note that gas flows of 1, 1.5, 2, 2.5, and 3 sccm correspond respectively to approximately $1.689\times10^{-3}$, $2.534\times10^{-3}$, $3.378\times4.223\times10^{-3}$, and $5.067\times10^{-3}$ pascal meter$^3$/sec). The corresponding pressures at the pressure sensor 1506 are measured and recorded by the controller 1616. FIG. 8B shows some exemplary calibration curves 1710. The upper straight-line curve, 1712 represents (for example) a curve for background gas pressure due to flow from the gas jet 1118 as simulated using flow through nozzle 1662 and as measured at pressure transducer 1506. Straight-line curve 1712 represents an exemplary curve that may result from such a sequence of measurements. The result is an essentially straight-line curve 1712, having a slope 1714 equal to $k_B$. The controller 1616 performs and stores the measurements, fits a straight-line, curve 1712 to the measured data, and extracts the slope 1714 and stores it as the calibrated sensitivity, $k_B$ in Torr/sccm (note that: 1 Torr/sccm is approximately 7.892 sec/meter$^3$), for pressure transducer 1506 to gas transported into the beamline chamber 1107 by gas jet 1118 (or by calibration gas flow injected by nozzle 1662.)

The sensitivity of the pressure transducer 1610 to background gas pressure in the beamline chamber 1107 resulting from gas flow into the beamline chamber 1107 because of the gas jet 1118 is represented by $k_C$ (in units of Torr/sccm, where 1 Torr/sccm is approximately 7.892 sec/meter$^3$). A calibration gas flow is introduced through nozzle 1662 into the beamline chamber 1107 and the pressure measured by the pressure transducer 1610 is expressed in units of Torr. For this calibration, the controller 1616 shuts off the gas jet 1118 by closing gas metering and shut-off valve 1640. Then controller 1616 controls two-way gas metering and shut-off valve 1646 to cause a sequence of flows through nozzle 1662 directly into the beamline chamber 1107 to simulate transport of gas into the beamline chamber 1107 by the gas jet 1118. For example, gas flows of 1, 2, 3, 4, and 5 sccm (or other sequence of values corresponding to typical gas flow into the beamline chamber 1107 due to the gas jet 1118 and any resulting beams during typical operation of the system) may be introduced into the beamline chamber 1107 under control by the controller 1616 (note that gas flows of 1, 2, 3, 4, and 5 sccm correspond respectively to approximately $1.689\times10^{-3}$, $3.378\times10^{-3}$, $5.057\times10^{-3}$, $6.756\times10^{-3}$, and $8.445\times10^{-3}$ pascal meter$^3$/sec). The corresponding pressures at the pressure sensor 1610 are measured and recorded by the controller 1616. FIG. 8B shows some exemplary calibration curves 1710. The lower straight-line curve 1722 represents an exemplary curve that may result from such a sequence of measurements. The result is an essentially straight-line curve 1722, having a slope 1724 equal to $k_C$. The controller 1616 performs and stores the measurements, fits a straight-line curve 1722 to the measured data and extracts the slope 1724 and stores it as the calibrated sensitivity, $k_C$ in Torr/sccm (note that: 1 Torr/sccm is approximately 7.892 sec/meter$^3$), for pressure transducer 1610 to gas transported into the beamline chamber 1107 by gas jet 1118 (or by calibration gas flow injected by nozzle 1652.)

It is understood by the inventors that $k_B$, $k_C$, and $k_D$ may have small errors that may result from the straight-line curves 1702, 1712, and 1722 not passing precisely through the origin (zero pressure at zero flow). This occurs when the base vacuum in the chamber is not adequately low. For practical purposes it is typically found that if the base vacuum is $10^{-7}$ Torr ($1.333\times10^{-5}$ pascal) or less, then the errors in $k_B$, $k_C$, and $k_D$ are so small that the error is inconsequential. In case of higher base vacuum pressures or if greatest precision is required, corrections to $k_B$, $k_C$, and $k_D$ may be made according to conventional techniques known to those skilled in the art to compensate for imperfect base vacuum conditions.

The calibration measurements for the system constants $k_A$, $k_B$, $k_C$, and $k_D$ are independent of one another and may be performed in any order. After measurement, the constants are stored by controller 1616 for display on display device 1656 or for future use in beam characterization and or process control. System constants $k_A$, $k_B$, $k_C$, and $k_D$ are constants that may exhibit long term drift due to component aging or may change as a result of replacement or adjustment of system components. Thus it is advisable to re-measure them periodically or after system maintenance or component replacement.

In addition to the system constants, other constants and conversions are used in the computations required for beam characterization. They are (with approximate values indicated): Avogadro's number, $N_A$ $$N_A = 6.022\times10^{23} \text{ atoms/mole (or molecules/mole)} = k_1$$

Molar volume, $V_m$ $$V_m = 2.24\times10^4 \text{ standard cm}^3/\text{mole} = k_2$$

Note that 1 pascal meter$^3$ is approximately 9.869 standard cm$^3$

Electronic charge, e $$e=1.602\times10^{-19} \text{ coulomb}=k_3$$

$$1 \text{ coulomb } 1 \text{ ampere-second}=6.242\times10^{18}e=k_4$$

milli-joule, $10^{-3}$ joule $$10^{-3} \text{ joule } 1 \text{ mW-sec}=6.242\times10^{15} \text{ eV}=k_5$$

Second, sec $$1 \text{ sec}=\tfrac{1}{60} \text{ minute}=k_6$$

$k_7$, atom-minutes/scc-sec, where scc=standard cm$^3$, and note that 1 pascal meter$^3$ is approximately 9.869 standard cm$^3$ $$k_7 = \frac{k_1 \times k_6}{k_2}$$
$$= 4.48 \times 10^{17}$$

In operating a Neutral Beam processing system such as that described above and shown in FIGS. 6 and 7, there is typically a portion of the gas jet 1118 that passes through the ionizer 1122 without becoming ionized. This un-ionized portion may comprise both clusters and monomers, but is not accelerated in the extraction region and continues as part of the beam 1514, traveling all the way to the sensor apparatus 1500 where it contributes to the pressure rise in the interior 1504 that is sensed by pressure transducer 1506. Since this never-ionized gas (referred to herein as "dead gas") sensed by pressure transducer 1506 has not been accelerated, it travels too slowly and with insufficient energy (a few milli-eV per monomer) to significantly contribute to Neutral Beam processing of a workpiece. Accordingly it may be separately accounted for in the Neutral Beam processing dosimetry, and may be separately measured as part of beam characterization methods of the invention. The contribution of background gas in the beamline chamber 1107 and dead gas from the gas jet at the pressure transducer 1506 is measured as follows:

Controller 1616 moves workpiece holder 1624 to the retracted position 1654 so that the entrance aperture 1536 of sensor apparatus 1500 is clear. Controller 1616 closes the two-way gas metering and shut-off valve 1646 and opens the gas metering and shut-off valve 1640 and sets the flow through the valve 1640 to a preselected flow rate that will be used for beam generation during Neutral Beam operation. Controller 1616 sets the values of $V_{Acc}$ and $V_S$ both to zero, so that no beam acceleration will occur. Controller 1616 sets the values of $V_A$ and $V_F$ both to preselected operating values that will be used for beam generation during Neutral Beam operation, so that the ionizer 1122 ionizes the neutral jet 1118 passing through the ionizer 1122 with the same ionizer conditions and efficiency that will be used for beam generation during Neutral Beam operation. The resulting GCIB comprises ionized and un-ionized portions, but neither of the portions is accelerated in the extraction region. The beam velocity (gas jet velocity) is so low that space charge effects in the GCIB, result in beam blow-up of the ionized portion, repelling all ions out of the beam, resulting in beam 1514 becoming a neutral beam traveling at low velocity along axis 1154 into the sensor apparatus 1500. Confirmation that all ions have been removed from the beam 1514 can be confirmed by measuring beam current $I_B$ as zero at Faraday cup 1502. Alternatively, controller can turn on $V_D$ to a small value, that deflects any remaining ionized portion 1604 out of the beam 1514. Under these conditions (Condition A) the following measurements are taken and stored by controller 1616:

$M_E$, the pressure at pressure transducer 1506, measured in Torr (note that: 1 pascal is approximately 0.007501 Torr)

$M_F$, the pressure at pressure transducer 1610, measured in Torr (note that: 1 pascal is approximately 0.007501 Torr)

Additional measurements are taken with conditions as follows: Controller 1616 moves workpiece holder 1624 to the retracted position 1654 so that the entrance aperture 1536 of sensor apparatus 1500 is clear. Controller 1616 closes the two-way gas metering and shut-off valve 1646 and opens the gas metering and shut-off valve 1640 and sets the flow through the valve 1640 to a preselected flow rate that will be used for beam generation during Neutral Beam operation. Controller 1616 sets the values of $V_{Acc}$ and $V_S$ both to preselected potentials that will be used for GCIB acceleration for beam generation during Neutral Beam operation. Controller 1616 sets the values of $V_A$ and $V_F$ both to preselected operating values that will be used for beam generation during Neutral Beam operation, so that the ionizer 1122 ionizes the neutral jet 1118 passing through the ionizer 1122 with the same ionizer conditions and efficiency that will be used for beam generation during Neutral Beam operation. The resulting GCIB 1128 is an accelerated GCIB. Controller 1616 sets $V_D$ to zero so that the beam 1514 is a GCIB that travels into sensor apparatus 1500. Under these conditions (Condition B) the following measurements are taken and stored by controller 1616:

$M_G$, the pressure at pressure transducer 1506, measured in Torr (note that: 1 pascal is approximately 0.007501 Torr)

$M_H$, the beam current $I_B$ collected by Faraday cup 1502, measured in amperes. This measurement is not required unless the beam contains ions and it is desired to characterize the size to charge ratio of ions in the beam.

$M_I$, the equilibrium or near equilibrium temperature measurement of the difference in temperature between temperature sensor 1520 and temperature sensor 1530, measured in kelvins.

Additional measurements are taken with conditions as follows: Controller 1616 moves workpiece holder 1624 to the retracted position 1654 so that the entrance aperture 1536 of sensor apparatus 1500 is clear. Controller 1616 closes the two-way gas metering and shut-off valve 1646 and opens the gas metering and shut-off valve 1640 and sets the flow through the valve 1640 to a preselected flow rate that will be used for beam generation during Neutral Beam operation. Controller 1616 sets the values of $V_{Acc}$ and $V_S$ both to preselected potentials that will be used for GCIB acceleration for beam generation during Neutral Beam operation. Controller 1616 sets the values of $V_A$ and $V_F$ both to preselected operating values that will be used for beam generation during Neutral Beam operation, so that the ionizer 1122 ionizes the neutral jet 1118 passing through the ionizer 1122 with the same ionizer conditions and efficiency that will be used for beam generation during Neutral Beam operation. The resulting GCIB 1128 is an accelerated GCIB. Controller 1616 sets $V_D$ to a preselected operating value that will be used for beam generation during Neutral Beam operation so that the beam 1514 is a Neutral Beam that travels into sensor apparatus 1500 and so that the ionized portion 1604 impacts the beam dump 1606. Under these conditions (Condition C) the following measurements are taken and stored by controller 1616:

$M_J$, the pressure at pressure transducer 1506, measured in Torr (note that: 1 pascal is approximately 0.007501 Torr)

$M_K$, the equilibrium or near equilibrium temperature measurement of the difference in temperature between temperature sensor 1520 and temperature sensor 1530, measured in kelvins.

Using the system constants $k_A$, $k_B$, $k_C$, and $k_D$ and the measured values $M_E$, $M_F$, $M_G$, $M_H$, $M_I$, $M_J$, and $M_K$, a comprehensive characterization of the beam 1516 may be calculated as follows:

$$C_L = \text{background gas (atoms/sec)}$$
$$= \frac{M_F \times k_B}{k_D \times k_C} \times \frac{N_A \times k_6}{k_2}$$
$$= \frac{M_F \times k_B}{k_D \times k_C} \times k_7;$$

$$C_M = \text{dead gas flow in beam (atoms/sec)}$$
$$= \frac{k_7 \times M_E}{k_D} - C_L;$$

$$C_N = \text{Full beam mass transport (atoms/sec)}$$
$$= \frac{k_7 \times M_G}{k_D};$$

Where "full beam" means beam 1514 with $V_D=0$ and includes any clusters, any monomers, any ionized clusters, any ionized monomers, including dead gas $$C_O = \text{Accelerated portion of full beam mass transport (atoms/sec)}$$
$$= C_N - (C_L + C_M);$$

$$C_P = \text{Accelerated neutral mass flow (atoms/sec)}$$
$$= \frac{k_7 \times M_J}{k_D} - (C_L + C_M);$$

or alternatively, $C_P$ can be calculated with identical result using:

$$C_P = \text{Accelerated neutral mass flow (atoms/sec)}$$
$$= \frac{k_7 \times (M_J - M_E)}{k_D};$$

$$C_Q = \text{Charged species mass flow (atoms/sec)}$$
$$= C_O - C_P;$$

$$C_R = \text{Charged species average size to charge ratio (atoms/q)}$$
$$= \frac{M_Q}{M_H \times k_4};$$

Where q represents the elementary positive charge, −e; note that this calculation depends upon a beam current measurement, but is not required for Neutral Beams and Dissociated Neutral Beams, since it only has meaning if the beam contains ions.

$$C_S = \text{Energy per atom in the neutral beam (eV)}$$
$$= \frac{M_K \times k_5}{k_A \times C_P};$$

$$C_T = \text{Energy per atom of the charged species (eV)}$$
$$= \frac{(M_I - M_K) \times k_5}{k_A \times C_Q};$$

$$C_U = \text{Energy per atom of accelerated portion of full beam (eV)}$$
$$= \frac{M_I \times k_5}{k_A \times C_O};$$

and $$C_V = \text{Total energy per charge of the charged species (keV)}$$
$$= \frac{C_R \times C_T}{1000}.$$

Note that the calculation of $C_V$ depends upon a beam current measurement, but is not required for Neutral Beams and Dissociated Neutral Beams, since it only has meaning if the beam contains ions.

In above calculation equations, $C_L$, $C_M$, . . . through $C_V$, the term "atom" is used in the sense defined herein above and not dependent on whether the atoms are dissociated or in clusters.

In certain situations a comprehensive beam characterization is not required. For example in controlling the dosimetry of a Neutral Beam process on a workpiece, often the only beam characteristics required to be known for successful dosimetry are $C_P$, the accelerated neutral mass flow of the Neutral Beam, and $C_S$, the energy per atom in the Neutral Beam. In such case an abbreviated method of beam characterization may be used. Using the system constants $k_A$, and $k_D$ and the measured values $M_E$, $M_J$, and $M_K$, a simplified characterization of the beam 1516 may be calculated as follows:

$$C_P = \text{Accelerated neutral mass flow (atoms/sec)}$$
$$= \frac{k_7 \times (M_J - M_E)}{k_D};$$

$$C_S = \text{Energy per atom in the neutral beam (eV)}$$
$$= \frac{M_K \times k_5}{k_A \times C_P}$$

The measurements and equations used in this disclosure use conventional United States units of measure for many measurements and equations (eg. Torr, sccm, etc.). The same measurements and equations can be represented in the International System of Units (SI) by direct conversion. When so converted, the form, but not the substance of the equations may appear different because the numeric values of constants and measurements are different in the different units of measure. The measurements and methods of the invention can be practiced equally in United States units of measure and in SI units of measure by employing SI equivalent units specified herein.

In summary, one embodiment of the present invention provides a sensor apparatus for characterizing a beam, comprising: an enclosure around a central region and having an aperture constructed for admitting a beam from a reduced pressure chamber into the central region for characterization; a beam strike disposed within the central region to receive the beam and to absorb energy from the beam, said strike at least partially thermally isolated from said enclosure; a temperature sensor for measuring a temperature change induced in the strike by the received beam; a first pressure sensor in fluid communication with the central region for measuring a pressure change within the enclosure caused by the beam admitted through the aperture; and a processing system for processing the measured temperature change and the measured pressure change to determine beam characteristics.

The beam may be derived from an accelerated gas cluster ion beam and may comprises gas clusters and/or gas cluster ions; and the beam strike may be adapted to dissociate said gas clusters and/or gas cluster ions. The apparatus may further comprise calibration means for calibrating the sensitivity, $k_D$, of the first pressure sensor to gas transported into the central region of the enclosure by the beam; and calibration means for calibrating the sensitivity, $k_A$, of the temperature sensor to beam power; and wherein the processing system uses $k_D$ and $k_A$ in determining beam characteristics. The apparatus may still further comprise calibration means for calibrating the sensitivity, $k_B$, of the first pressure sensor to background gas pressure in the reduced pressure chamber; and wherein the processing system uses $k_B$ in determining beam characteristics. The apparatus may even further comprise a second pressure sensor adapted to measure pressure in the reduced pressure chamber; and calibration means for calibrating the sensitivity, $k_C$, of the second pressure sensor to a change in background gas pressure in the reduced pressure chamber; and wherein the processing system uses $k_C$ in determining beam characteristics.

The beam may be a Neutral Beam or a Dissociated Neutral Beam and the processing system may determine one or more beam characteristics selected from the group consisting of: dead gas flow in beam, $C_M$; full beam mass transport, $C_N$; accelerated portion of full beam mass transport, $C_O$; accelerated mass neutral flow, $C_P$; energy per atom in the neutral beam, $C_S$; and energy per atom of the accelerated portion of full beam, $C_U$.

The temperature sensor may include first and second temperature sensors located for measuring temperatures of the beam strike and the enclosure, respectively. The enclosure may be adapted to act as a Faraday cup for collecting ion beam charge and measuring a beam current, and the processing system may be adapted to use the beam current measurement to determine beam characteristics. The beam may be derived from an accelerated gas cluster ion beam and may comprises ions and the processing system determines one or more beam characteristics selected from the group consisting of; full beam mass transport, $C_N$; charged species mass flow, $C_Q$; charged species average size to charge ratio, $C_R$; energy per atom of the charged species, $C_T$; and total energy per charge of the charged species, $C_V$.

The beam may be a Neutral Beam or a Dissociated Neutral Beam. The apparatus may further comprise: a reduced pressure chamber; a gas cluster ion beam generator; means for accelerating the gas cluster ion beam; means for transforming the accelerated gas cluster ion beam into a Neutral Beam having a trajectory; means for disposing the aperture in the enclosure in trajectory for admitting the beam into the central region for measurement and characterization; workpiece, holding means for introducing a workpiece into the trajectory; wherein the processing means uses determined beam characteristics to control Neutral Beam treatment of the workpiece.

Another embodiment of the present invention provides a method for characterizing a particle beam, comprising: receiving a particle beam in a central region of a reduced pressure enclosure; impacting the received beam against a beam strike that is thermally isolated from the enclosure; measuring a temperature change of the beam strike due to the impacting beam; measuring a pressure change in the enclosure due to receiving the beam; and processing the measured temperature change and the measured pressure change to determine beam characteristics.

The method may further comprise the steps of calibrating sensitivity, $k_D$, of a pressure sensor for the enclosure to gas pressure changes created by receiving the beam and calibrating sensitivity, $k_A$, of a temperature sensor of the beam strike to beam power of the impacting beam, wherein the step of processing system uses $k_D$ and $k_A$ in determining beam characteristics.

The method may further comprise the steps of measuring the pressure in the reduced pressure enclosure, and using the measured pressure in the reduced pressure chamber to determine beam characteristics in the processing step. The method may still further comprise the steps of calibrating sensitivity, $K_C$, of a pressure sensor in the reduced pressure enclosure, and using the sensitivity $K_C$ in to determine beam characteristics in the processing step.

The beam may be a Neutral Beam or a Dissociated Neutral Beam and the processing step may determine one or more beam characteristics selected from the group consisting of: dead gas flow in beam, $C_M$; full beam mass transport, $C_N$; accelerated portion of full beam mass transport, $C_O$; accelerated mass neutral flow, $C_P$; energy per atom in the neutral beam, $C_S$; and energy per atom of the accelerated portion of full beam, $C_U$.

The method may further comprise measuring electrical current in the enclosure and the beam strike due to receiving and impacting the beam, wherein the step of processing includes processing the measured electrical current to determine beam characteristics. The beam may be derived from an accelerated gas cluster ion beam and comprises ions and the processing system may determine one or more beam characteristics selected from the group consisting of; full beam mass transport, $C_N$; charged species mass flow, $C_Q$; charged species average size to charge ratio, $C_R$; energy per atom of the charged species, $C_T$; and total energy per charge of the charged species, $C_V$.

Yet another embodiment of the present invention provides a method of determining one or more characteristics of a beam having a trajectory in a reduced pressure chamber, comprising the steps; providing an enclosure having a central region and an aperture connected to the reduced pressure chamber for admitting the beam into the central region for characterization; providing a beam strike disposed within the central region to receive the admitted beam and to absorb energy from the beam, said strike being at least partially thermally isolated from said enclosure; providing a temperature sensor for measuring a temperature change induced in the strike by the received beam to provide a beam power measurement signal; providing a first pressure sensor in fluid communication with the central region for measuring a pressure change within the enclosure caused by the beam admitted through the aperture, to provide a beam gas transport measurement signal; providing processing means for processing the beam power measurement signal and the beam gas transport measurement signal to determine beam characteristics.

The method may further comprise providing a control system using at least one determined beam characteristic to control a process. The may further comprise providing an apparatus in the reduced pressure chamber to produce a gas cluster ion beam. The may still further comprise providing elements within the reduced pressure chamber to fully neutralize the gas cluster ion beam. The method may even further comprise providing elements in the reduced pressure chamber to dissociate the gas cluster ion beam.

Although the invention has been described with respect to various embodiments, it will be realized by those skilled in the arts that this invention is also capable of a wide variety of further and other embodiments within the spirit and scope of the foregoing disclosure and the appended claims.

What is claimed is:

1. A sensor apparatus for characterizing a beam, comprising:
   an enclosure around a central region and having an aperture constructed for admitting a beam from a reduced pressure chamber into the central region for characterization;
   a beam strike disposed within the central region to receive the beam and to absorb energy from the beam, said strike at least partially thermally isolated from said enclosure;
   a temperature sensor for measuring a temperature change induced in the strike by the received beam;
   a first pressure sensor in fluid communication with the central region for measuring a pressure change within the enclosure caused by the beam admitted through the aperture; and
   a processing system for processing the measured temperature change and the measured pressure change to determine beam characteristics.

2. The sensor apparatus of claim 1, wherein the beam is derived from an accelerated gas cluster ion beam and comprises gas clusters and/or gas cluster ions; further wherein the beam strike is adapted to dissociate said gas clusters and/or gas cluster ions.

3. The sensor apparatus of claim 1, further comprising:
   calibration means for calibrating the sensitivity, $k_D$, of the first pressure sensor to gas transported into the central region of the enclosure by the beam; and
   calibration means for calibrating the sensitivity, $k_A$, of the temperature sensor to beam power; and wherein the processing system uses $k_D$ and $k_A$ in determining beam characteristics.

4. The sensor apparatus of claim 3, further comprising:
   calibration means for calibrating the sensitivity, $k_B$, of the first pressure sensor to background gas pressure in the reduced pressure chamber; and
   wherein the processing system uses $k_B$ in determining beam characteristics.

5. The sensor apparatus of claim 3, further comprising:
   a second pressure sensor adapted to measure pressure in the reduced pressure chamber; and
   calibration means for calibrating the sensitivity, $k_C$, of the second pressure sensor to a change in background gas pressure in the reduced pressure chamber; and
   wherein the processing system uses k in determining beam characteristics.

6. The sensor apparatus of claim 1, wherein the beam is a Neutral Beam or a Dissociated Neutral Beam and the processing system determines one or more beam characteristics selected from the group consisting of:
   dead gas flow in beam, $C_M$;
   full beam mass transport, $C_N$;
   accelerated portion of full beam mass transport, $C_O$;
   accelerated mass neutral flow, $C_P$;
   energy per atom in the neutral beam, $C_S$; and
   energy per atom of the accelerated portion of full beam, $C_U$.

7. The sensor apparatus of claim 1, wherein the temperature sensor includes first and second temperature sensors located for measuring temperatures of the beam strike and the enclosure, respectively.

8. The sensor apparatus of claim 1, wherein the enclosure is adapted to act as a Faraday cup for collecting ion beam charge and measuring a beam current, and further Wherein the processing system is adapted to use the beam current measurement to determine beam characteristics.

9. The sensor apparatus of claim 8, wherein the beam is derived from an accelerated gas cluster ion beam and comprises ions and the processing system determines one or more beam characteristics selected from the group consisting of:
   full beam mass transport, $C_N$;
   charged species mass flow, $C_Q$;
   charged species average size to charge ratio, $C_R$;
   energy per atom of the charged species, $C_T$; and
   total energy per charge of the charged species, $C_V$.

10. The sensor apparatus of claim 1, wherein the beam is a Neutral Beam.

11. The sensor apparatus of claim 10, wherein the beam is a Dissociated Neutral Beam.

12. The sensor apparatus of claim 1, further comprising:
    a reduced pressure chamber;
    a gas cluster ion beam generator;
    means for accelerating the gas cluster ion beam;
    means for transforming the accelerated gas cluster ion beam into a Neutral Beam having a trajectory;
    means for disposing the aperture in the enclosure in trajectory for admitting the beam into the central region for measurement and characterization;
    workpiece holding means for introducing a workpiece into the trajectory;
    wherein the processing means uses determined beam characteristics to control Neutral Beam treatment of the workpiece.

13. A method for characterizing a particle beam, comprising:
    receiving a particle beam in a central region of a reduced pressure enclosure;
    impacting the received beam against a beam strike that is thermally isolated from the enclosure;
    measuring a temperature change of the beam strike due to the impacting beam;
    measuring a pressure change in the enclosure due to receiving the beam; and
    processing the measured temperature change and the measured pressure change to determine beam characteristics.

14. The method of claim 13, further comprising the steps of:
    calibrating sensitivity, $k_D$, of a pressure sensor for the enclosure to gas pressure changes created by receiving the beam; and
    calibrating sensitivity, $k_A$, of a temperature sensor of the beam strike to beam power of the impacting beam,
    wherein the step of processing system uses $k_D$ and $k_A$ in determining beam characteristics.

15. The method of claim 13, further comprising the steps of measuring the pressure in the reduced pressure enclosure, and using the measured pressure in the reduced pressure chamber to determine beam characteristics in the processing step.

16. The method of claim 15, further comprising the steps of calibrating sensitivity, $K_C$, of a pressure sensor in the reduced pressure enclosure, and using the sensitivity $K_C$ in to determine beam characteristics in the processing step.

17. The method of claim 13, wherein the beam is a Neutral Beam or a Dissociated Neutral Beam and the processing step determines one or more beam characteristics selected from the group consisting of:
- dead gas flow in beam, $C_M$;
- full beam mass transport, $C_N$;
- accelerated portion of full beam mass transport, $C_O$;
- accelerated mass neutral flow, $C_P$;
- energy per atom in the neutral beam, $C_S$; and
- energy per atom of the accelerated portion of full beam, $C_U$.

18. The method of claim 13, further comprising measuring electrical current in the enclosure and the beam strike due to receiving and impacting the beam, wherein the step of processing includes processing the measured electrical current to determine beam characteristics.

19. The method of claim 18, wherein the beam is derived from an accelerated gas cluster ion beam and comprises ions and the processing system determines one or more beam characteristics selected from the group consisting of:
- full beam mass transport, $C_N$;
- charged species mass flow, $C_Q$;
- charged species average size to charge ratio, $C_R$;
- energy per atom of the charged species, $C_T$; and
- total energy per charge of the charged species, $C_V$.

20. A method of determining one or more characteristics of a beam having a trajectory in a reduced pressure chamber, comprising the steps:
- providing an enclosure having a central region and an aperture connected to the reduced pressure chamber for admitting the beam into the central region for characterization;
- providing a beam strike disposed within the central region to receive the admitted beam and to absorb energy from the beam, said strike being at least partially thermally isolated from said enclosure;
- providing a temperature sensor for measuring a temperature change induced in the strike by the received beam to provide a beam power measurement signal;
- providing a first pressure sensor in fluid communication with the central region for measuring a pressure change within the enclosure caused by the beam admitted through the aperture, to provide a beam gas transport measurement signal;
- providing processing means for processing the beam power measurement signal and the beam gas transport measurement signal to determine beam characteristics.

21. The method of claim 20, further comprising providing a control system using at least one determined beam characteristic to control a process.

22. The method of claim 20, further comprising providing an apparatus in the reduced pressure chamber to produce a gas cluster ion beam.

23. The method of claim 22, further comprising providing elements within the reduced pressure chamber to fully neutralize the gas cluster ion beam.

24. The method of claim 22, further comprising providing elements in the reduced pressure chamber to dissociate the gas cluster ion beam.

* * * * *

UNITED STATES PATENT AND TRADEMARK OFFICE
CERTIFICATE OF CORRECTION

| | |
|---|---|
| PATENT NO. | : 9,117,628 B2 |
| APPLICATION NO. | : 13/660295 |
| DATED | : August 25, 2015 |
| INVENTOR(S) | : Sean R. Kirkpatrick and Allen R. Kirkpatrick |

It is certified that error appears in the above-identified patent and that said Letters Patent is hereby corrected as shown below:

In the claims,

Column 29
Claim 5 should read:
The sensor apparatus of claim 3, further comprising,
a second pressure sensor adapted to measure pressure
    in the reduced pressure chamber; and
calibration means for calibrating the sensitivity, $k_C$, of the
    second pressure sensor to a change in background gas
    pressure in the reduced pressure chamber; and
wherein the processing system uses $k_C$ in determining beam
    characteristics.

Page 1 of 1

Signed and Sealed this
Twenty-ninth Day of December, 2015

Michelle K. Lee
*Director of the United States Patent and Trademark Office*